(12) United States Patent
Lee et al.

(10) Patent No.: US 11,378,892 B2
(45) Date of Patent: Jul. 5, 2022

(54) OVERLAY-SHIFT MEASUREMENT SYSTEM

(71) Applicant: Taiwan Semiconductor Manufacturing Company, Ltd., Hsinchu (TW)

(72) Inventors: Yu-Ching Lee, Kaohsiung (TW); Yu-Piao Fang, Tainan (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 17/329,772

(22) Filed: May 25, 2021

(65) Prior Publication Data

US 2021/0278769 A1 Sep. 9, 2021

Related U.S. Application Data

(62) Division of application No. 16/100,365, filed on Aug. 10, 2018, now Pat. No. 11,022,889.

(Continued)

(51) Int. Cl.
*G03F 7/20* (2006.01)
*G03F 9/00* (2006.01)
*B82Y 20/00* (2011.01)

(52) U.S. Cl.
CPC ........ *G03F 7/70633* (2013.01); *G03F 7/2022* (2013.01); *G03F 7/70466* (2013.01);
(Continued)

(58) Field of Classification Search
CPC .............. G03F 7/2022; G03F 7/70683; G03F 7/70625; G03F 7/70633; G03F 7/70466; G03F 7/70641; G03F 7/70616–70683; G03F 9/7076; G03F 9/7003–7046; G03F 9/7069; G03F 9/7073–7084; G03F 9/7088; G03F 9/7092; B82Y 20/00; G02B 6/1225; H01L 22/12; H01L 22/30; H01L 23/544;
(Continued)

(56) References Cited

U.S. PATENT DOCUMENTS 7,088,902 B2 8/2006 Katoh et al.
7,940,386 B1 5/2011 Bevis
(Continued)

FOREIGN PATENT DOCUMENTS

JP 2006343407 A * 12/2006

OTHER PUBLICATIONS

Peng et al., "Overlay Alignment Using Two Photonic Crystals," Jan. 2006. (Year: 2006).*

*Primary Examiner* — Christina A Riddle
(74) *Attorney, Agent, or Firm* — McClure, Qualey & Rodack, LLP

(57) ABSTRACT

Overlay-shift measurement systems are provided. An overlay-shift measurement system includes an optical device, a first light detection device and a processor. The optical device is configured to provide an input light to a metrology target of a semiconductor structure. The first light detection device is configured to receive a transmitted light from the metrology target when the input light penetrates the metrology target. The processor is configured to determine whether overlay-shift between a plurality of first photonic crystals and a plurality of second photonic crystals in the metrology target is present according to characteristics of the transmitted light.

20 Claims, 41 Drawing Sheets

Related U.S. Application Data

(60) Provisional application No. 62/584,995, filed on Nov. 13, 2017.

(52) U.S. Cl.
CPC ...... *G03F 7/70625* (2013.01); *G03F 7/70641* (2013.01); *G03F 7/70683* (2013.01); *G03F 9/7076* (2013.01); *B82Y 20/00* (2013.01)

(58) Field of Classification Search
CPC ......... H01L 2223/54426; H01L 21/027; H01L 2933/00; H01L 2933/0083; H01L 2223/544; H01L 2223/54453
USPC .... 355/46, 52–55, 67–71, 72–77; 430/8, 14, 430/15, 22, 30, 54, 394; 356/399–401
See application file for complete search history.

(56) References Cited

U.S. PATENT DOCUMENTS

| | | |
|---|---|---|
| 9,152,040 B1 | 10/2015 | Brueck et al. |
| 2006/0244969 A1* | 11/2006 | Ryan ................ G01N 21/95692 356/446 |
| 2006/0279735 A1 | 12/2006 | van Haren et al. |
| 2007/0114678 A1 | 5/2007 | van Haren et al. |
| 2007/0132996 A1 | 6/2007 | van Haren et al. |
| 2007/0217464 A1 | 9/2007 | Tamamori et al. |
| 2011/0024924 A1 | 2/2011 | Shih et al. |
| 2011/0204484 A1 | 8/2011 | van der Schaar et al. |

* cited by examiner

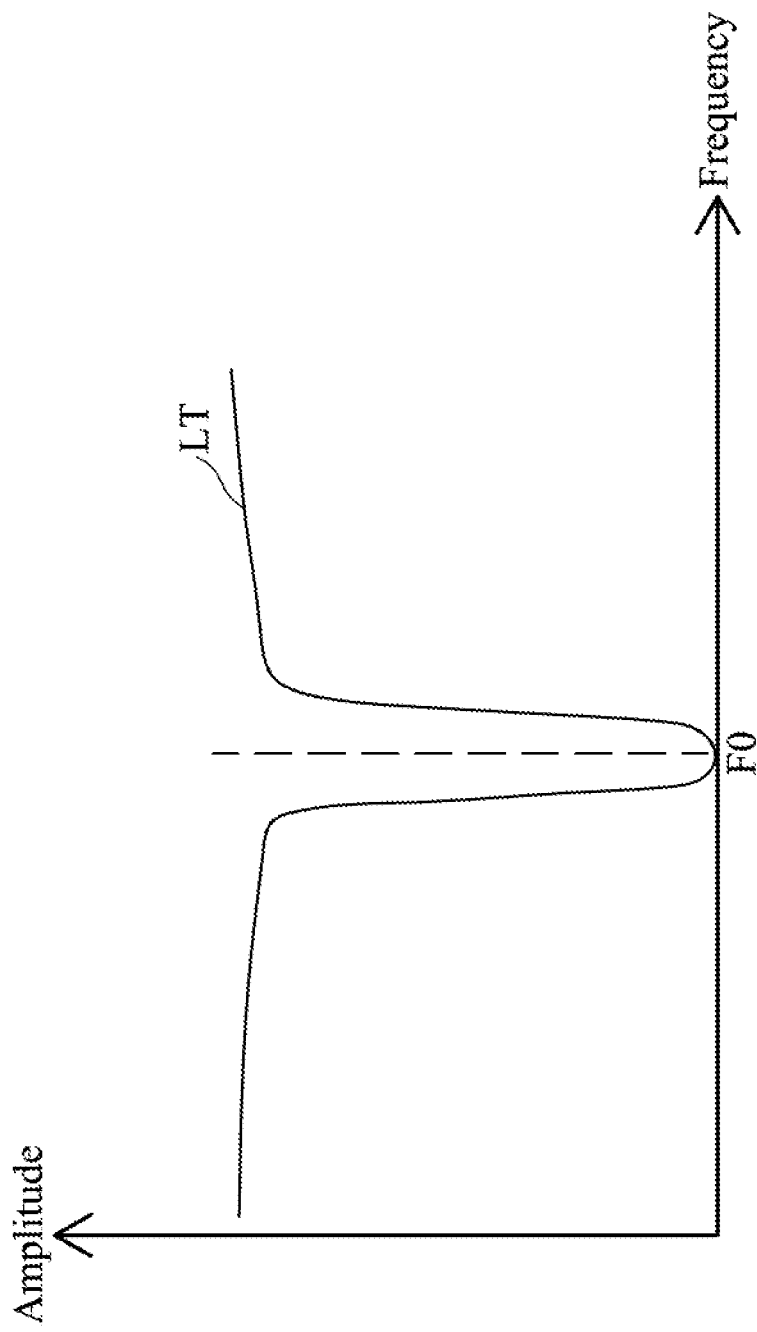

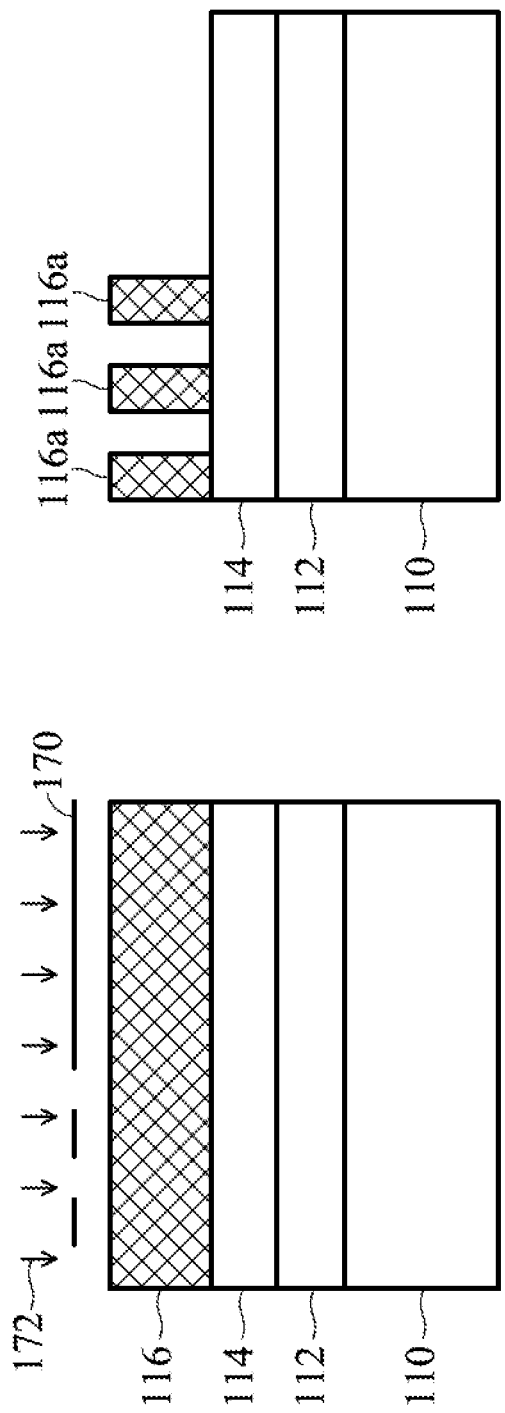
FIG. 6A
FIG. 6B
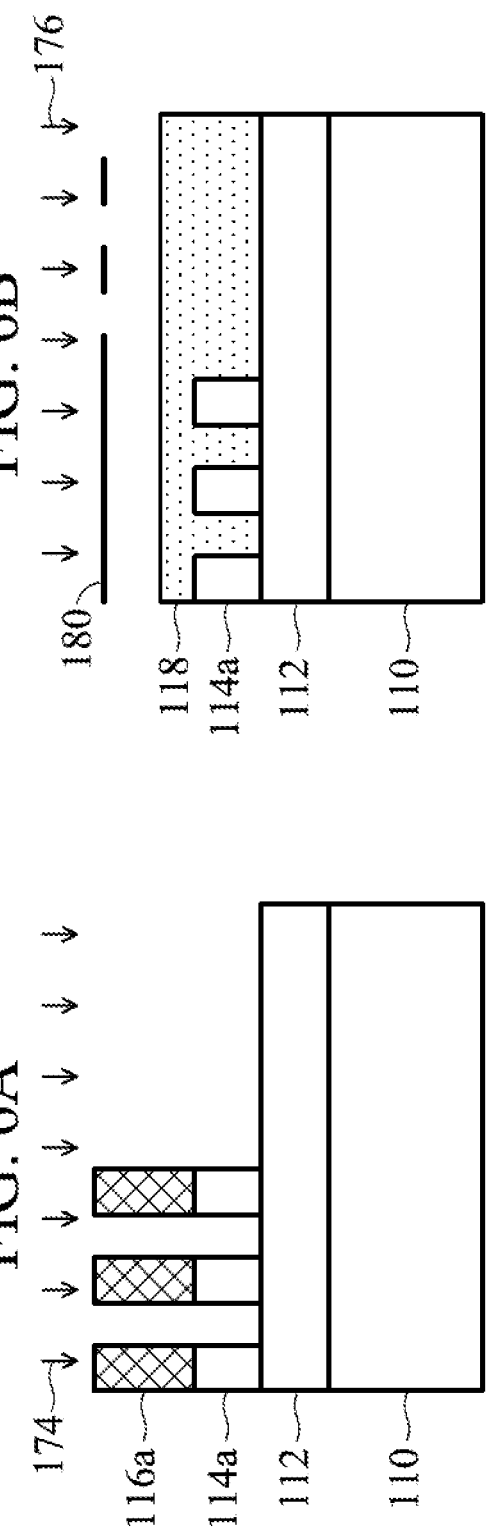
FIG. 6C
FIG. 6D

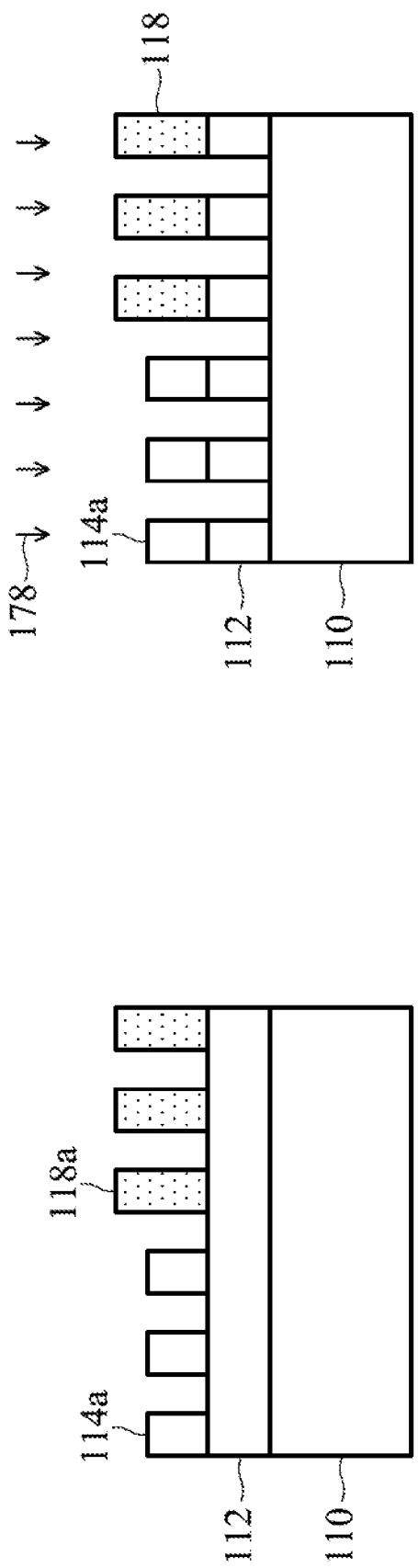
FIG. 6F
FIG. 6E
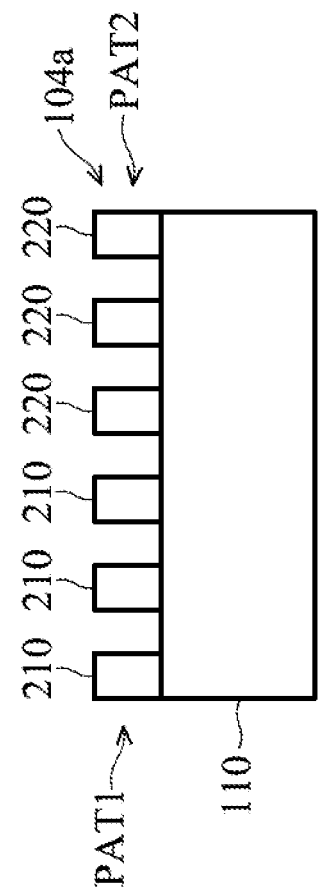
FIG. 6G

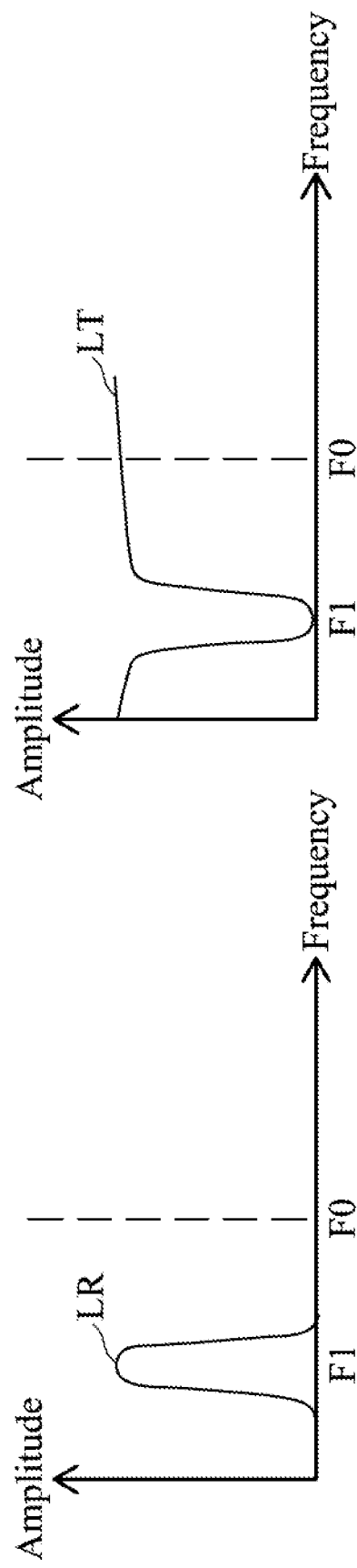

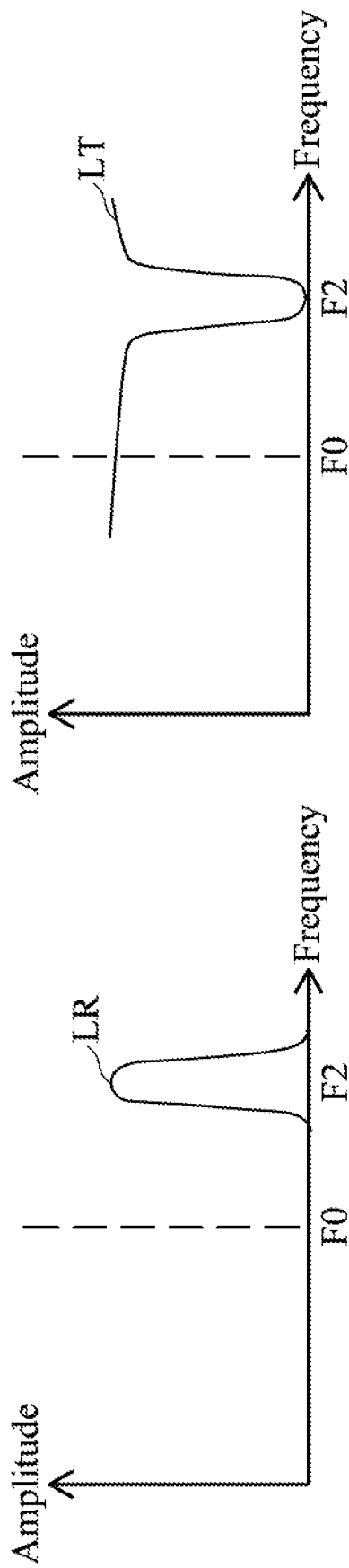

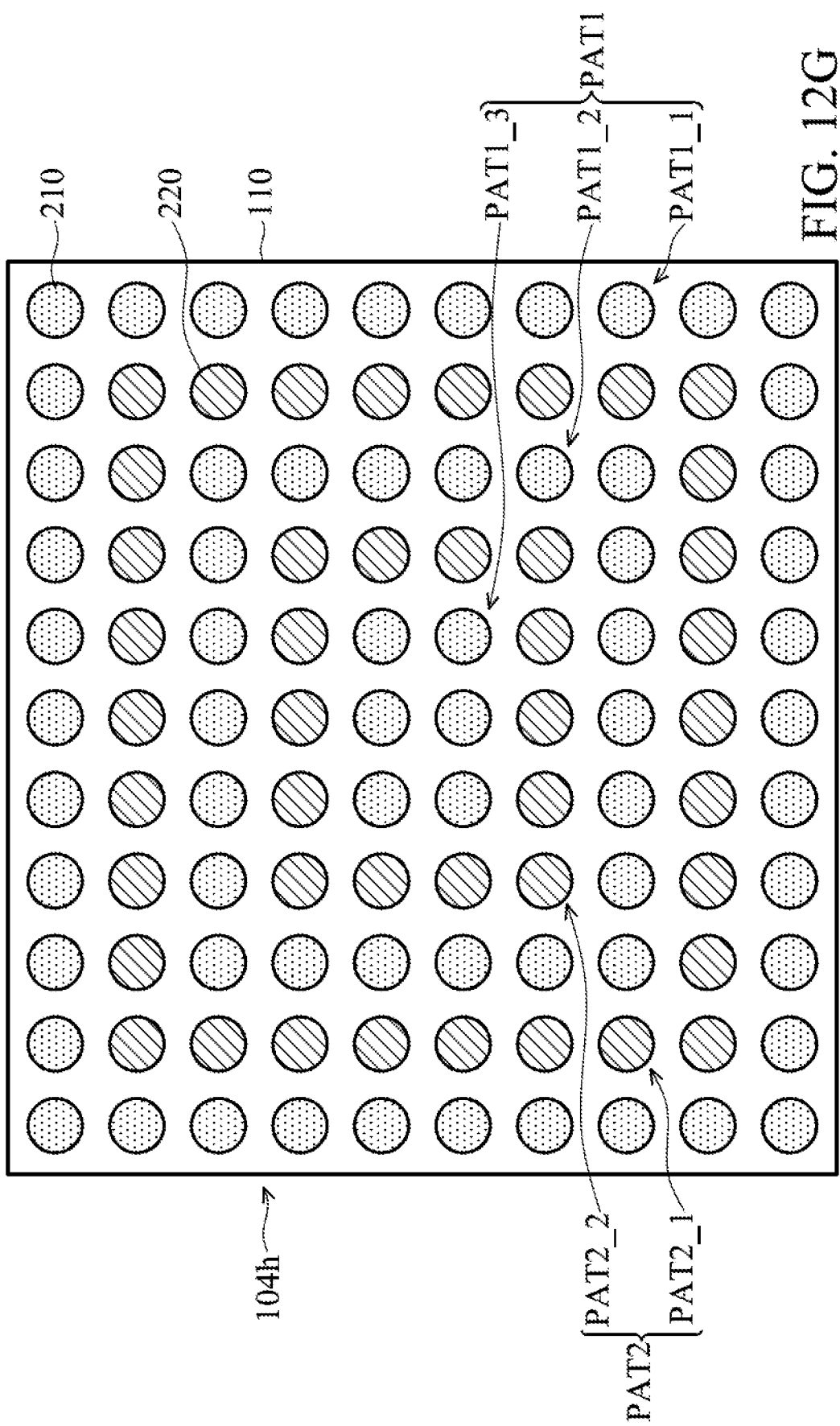

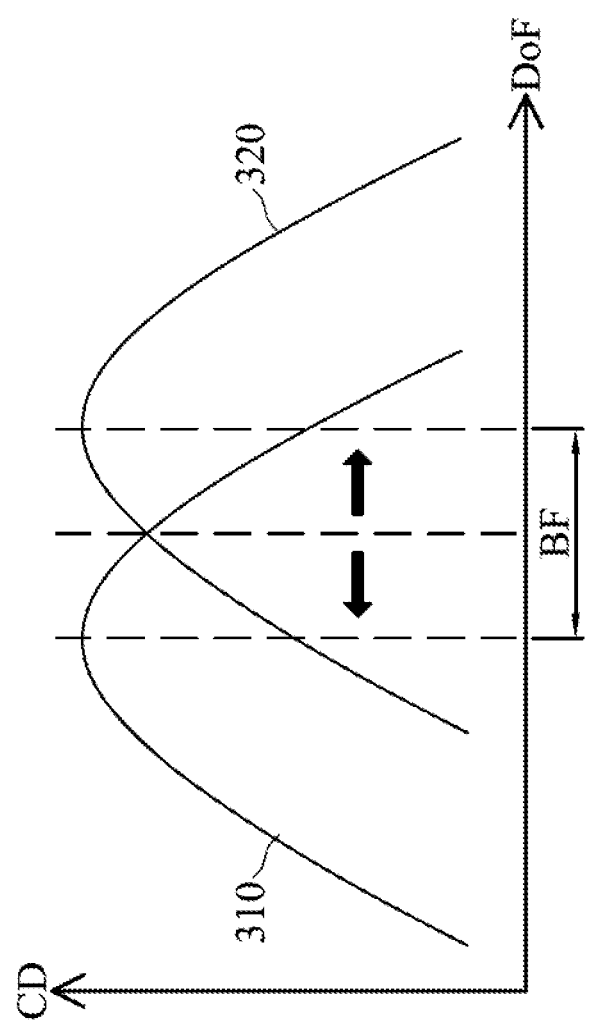

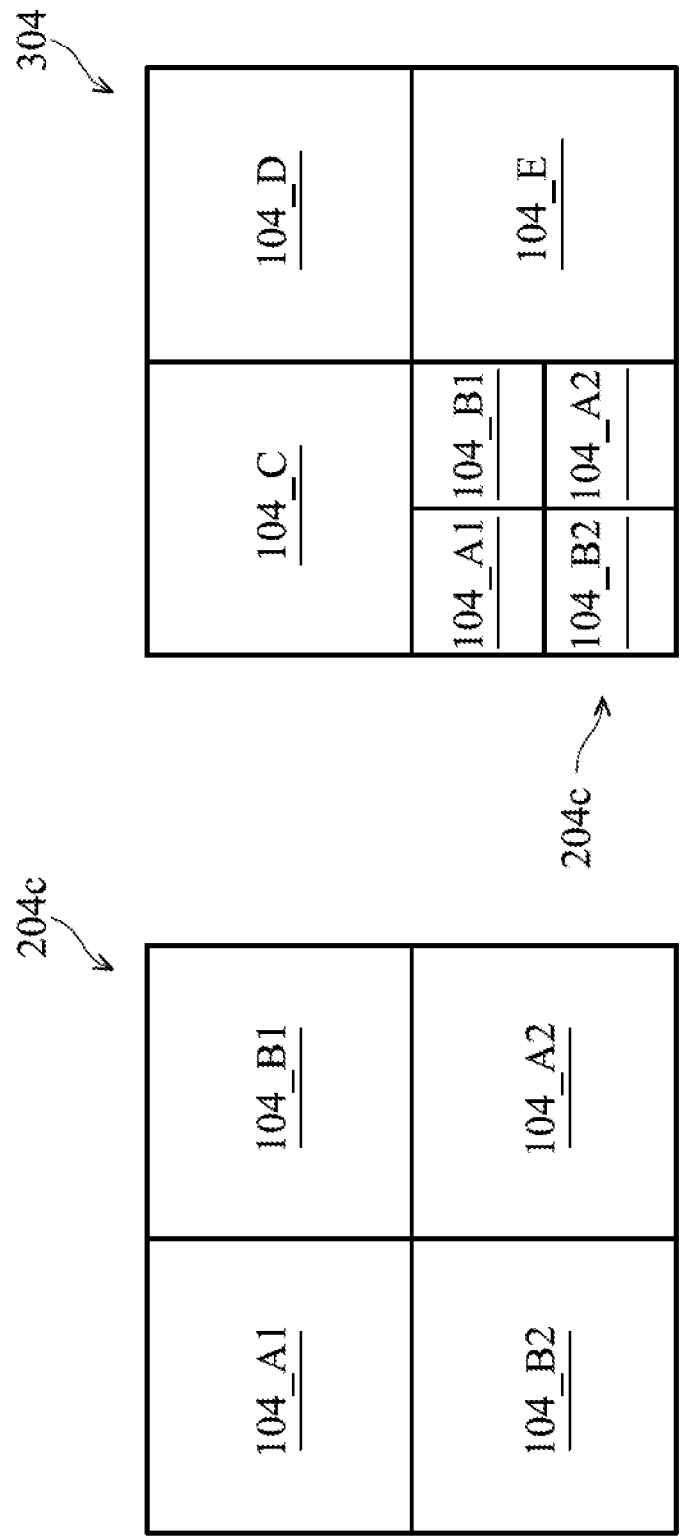

OVERLAY-SHIFT MEASUREMENT SYSTEM

CROSS REFERENCE TO RELATED APPLICATIONS

This Application is a Divisional of application Ser. No. 16/100,365, filed on Aug. 10, 2018, now U.S. Pat. No. 11,022,889, which claims priority of U.S. Provisional Application No. 62/584,995, filed on Nov. 13, 2017, the entirety of which are incorporated by reference herein.

BACKGROUND

Generally, a semiconductor integrated circuit (IC) is formed on multiple layers of a semiconductor substrate (or a semiconductor wafer). In order to properly fabricate a semiconductor integrated circuit, some layers of the substrate need to be aligned with each other. In such cases, a metrology target (or alignment mark) formed in a semiconductor substrate is utilized to perform the overlay (or alignment) measurements.

The traditional metrology target may include a plurality of gratings, and an overlay shift between different layers of the semiconductor substrate can be measured based on the arrangement of the gratings.

Although existing metrology targets have generally been adequate for their intended purposes, they have not been entirely satisfactory in all respects. Consequently, there is a need for new metrology target that provides a solution for the overlay-shift measurement, critical dimensions (CD), and depth-of-focus (DoF).

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIG. 5C shows an optical spectrum of the transmitted light LT of FIG. 4.

FIGS. 6A-6G show cross-sectional representations of various stages of forming the metrology target of FIG. 3A, in accordance with some embodiments of the disclosure.

FIG. 8B shows an optical spectrum of the reflected light LR of FIG. 8A.

FIG. 8C shows an optical spectrum of the transmitted light LT of FIG. 8A.

FIG. 9B shows an optical spectrum of the reflected light LR of FIG. 9A.

FIG. 9C shows an optical spectrum of the transmitted light LT of FIG. 9A.

FIGS. 12A-12G show top views of various metrology targets, in accordance with some embodiments of the disclosure.

FIG. 15D shows the Bossung curves of the mixed metrology target of FIG. 15A, in accordance with some embodiments of the disclosure.

FIG. 18 shows a schematic illustrating a mixed metrology target, in accordance with some embodiments of the disclosure.

FIG. 19 shows a schematic illustrating of a compound metrology target, in accordance with some embodiments of the disclosure.

DETAILED DESCRIPTION

Figure 1:
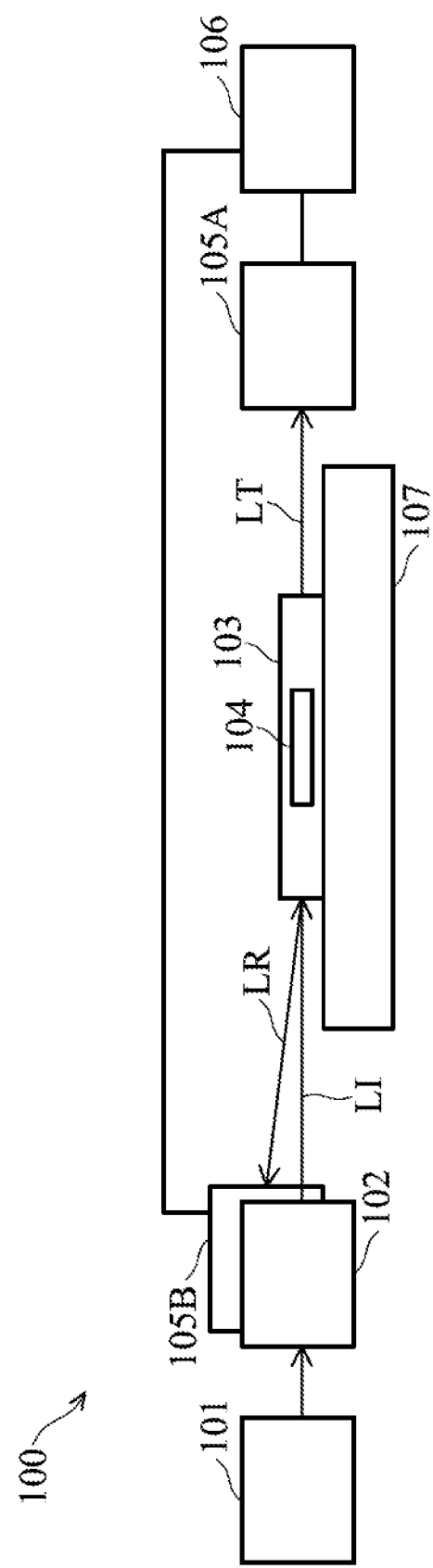
FIG. 1 shows a block diagram illustrating a schematic diagram of an overlay-shift measurement system, in accordance with some embodiments of the disclosure.

The following disclosure provides many different embodiments, or examples, for implementing different features of the subject matter provided. Specific examples of components and arrangements are described below to simplify the present disclosure. These are, of course, merely examples and are not intended to be limiting. In some embodiments, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some variations of the embodiments are described. Throughout the various views and illustrative embodiments, like reference numbers are used to designate like elements. It should be understood that additional operations can be provided before, during, and/or after a disclosed method, and some of the operations described can be replaced or eliminated for other embodiments of the method.

FIG. 1 shows a block diagram illustrating a schematic diagram of an overlay-shift measurement system 100, in accordance with some embodiments of the disclosure. The overlay-shift measurement system 100 includes a light source 101, an optical device 102, the light detection devices 105A and 105B, and a processor 106. The overlay-shift measurement system 100 is capable of measuring a semiconductor structure 103 on a stage 107. The semiconductor structure 103 includes a metrology target (or alignment mark) 104. In some embodiments, the semiconductor structure 103 is a wafer or a chip.

In some embodiments, the overlay-shift measurement system 100 may perform a diffraction-based overlay (DBO) measurement on the metrology target 104. For example, the light source 101 is configured to provide light to the optical device 102, and then the optical device 102 is configured to provide an input light LI to the metrology target 104. In some embodiments, the input light LI is a pulsed or broadband light that horizontally illuminates the metrology target 104, and the wavelength of the input light LI is about 13.5 nm to 1000 nm. In response to the input light LI illuminating the metrology target 104, the reflected light LR and/or the transmitted light LT are generated. The light detection device 105A is configured to detect the transmitted light LT and then generates the data corresponding to the transmitted light LT (e.g., the image data generated by the transmitted light LT). Similarly, the light detection device 105B is configured to detect the reflected light LR and then generates the data corresponding to the reflected light LR (e.g., the image data generated by the reflected light LR). In such embodiments, the light detection device 105B is disposed on the same side of the optical device 102, and the light detection device 105A is disposed on an opposite side of the optical device 102. The processor 106 is configured to receive the data from the light detection devices 105A and 105B, and the data includes characteristics of the reflected light LR and the transmitted light LT. Subsequently, the processor 106 analyzes the data to determine the overlay-shift (OVL) between multiple photonic crystals formed in the metrology target 104. In some embodiments, the characteristics of the reflected light LR and the transmitted light LT include information regarding center wavelength shift, scattering wavelength count, scatter angle, center wavelength intensity, full width at half maximum or photonic band gap. Detail of the characteristics of the reflected light LR and the transmitted light LT are described below.

In some embodiments, the optical device 102 is disposed above the metrology target 104, and the optical device 102 is configured to provide the input light LI to the metrology target 104 with an incidence angle. Furthermore, the light detection devices 105A and 105B are arranged at the positions appropriate for receiving the reflected light LR and/or the transmitted light LT according to the incidence angle.

In some embodiments, the metrology target 104 is positioned at the edge of the wafer. In some embodiments, the metrology target 104 is positioned in the test line of the wafer or chip.

Figure 2:
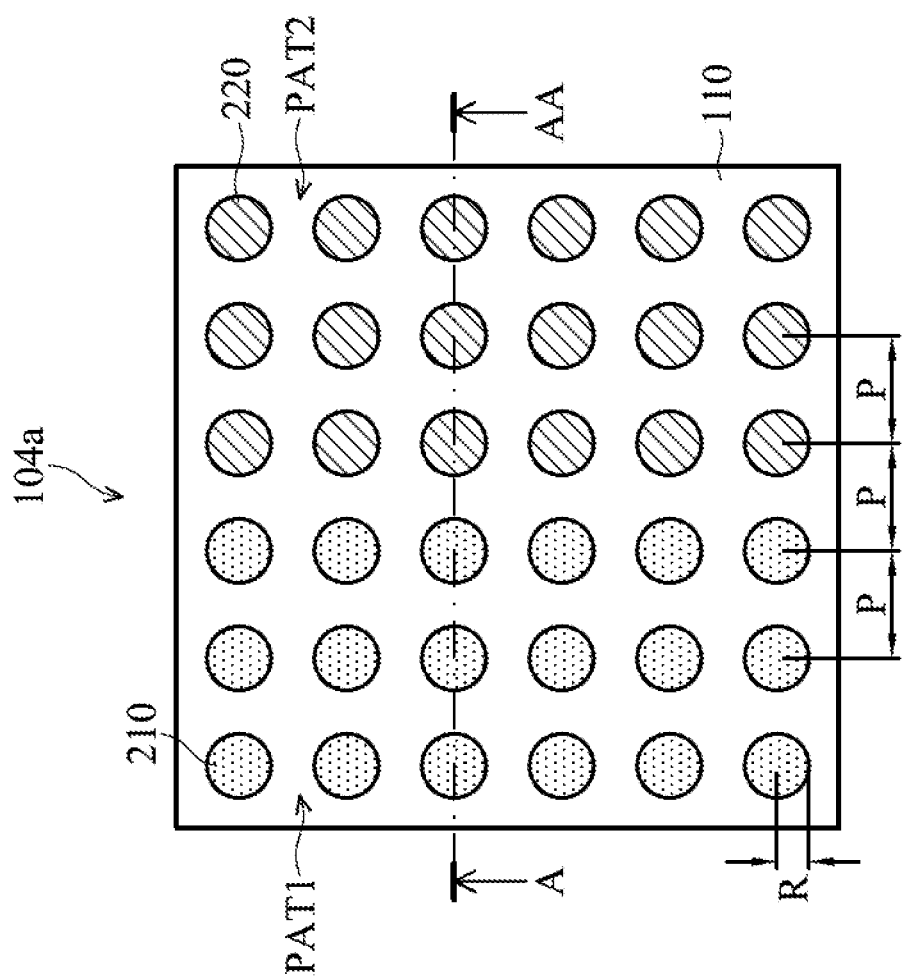
FIG. 2 shows a top view of a metrology target, in accordance with some embodiments of the disclosure.

FIG. 2 shows a top view of a metrology target 104a, in accordance with some embodiments of the disclosure. The metrology target 104a is a cluster-type photonic crystalline structure, and includes a first pattern PAT1 and a second pattern PAT2. The first pattern PAT1 and the second pattern PAT2 are formed on a semiconductor substrate 110. The first pattern PAT1 is formed by multiple photonic crystals 210, and the photonic crystals 210 are arranged in an array with the same pitch P. The second pattern PAT2 is formed by multiple photonic crystals 220, and the photonic crystals 220 are arranged in an array with the same pitch P. Furthermore, the distances between the rightmost photonic crystal 210 of the first pattern PAT1 and the leftmost photonic crystal 220 of the second pattern PAT2 are equal to the pitch P. In the metrology target 104a, the photonic crystals 210 and 220 have the same sectional shape and same size. In such embodiments, the sectional shape of the photonic crystals 210 and 220 is a point-symmetry shape. For example, each sectional shape of the photonic crystals 210 and 220 is a circular shape with a radius R. In some embodiments, the pitch P and the radius R are about 10 nm to 10 μm.

In the metrology target 104a, the photonic crystals 210 are formed by a first layer mask corresponding to a first layer of the semiconductor structure 103, and the photonic crystals 220 are formed by a second layer mask corresponding to a second layer of the semiconductor structure 103. The first and second layer masks are used in successive patterning steps, and the first layer mask is used in a previous patterning step and the second layer mask is used in a subsequent patterning step. Furthermore, the photonic crystals 210 and 220 are arranged in the same rows. For example, the centers of the third row of photonic crystals 210 and 220 are positioned on the line A-AA. Furthermore, the distances between the rightmost photonic crystal 210 of the first pattern PAT1 and the leftmost photonic crystal 220 of the second pattern PAT2 are equal to the pitch P. Thus, no overlay-shift is present between the first and second layer masks in the metrology target 104a, i.e., the overlay-shift is equal to zero (e.g., OVL=0).

Figure 3A:
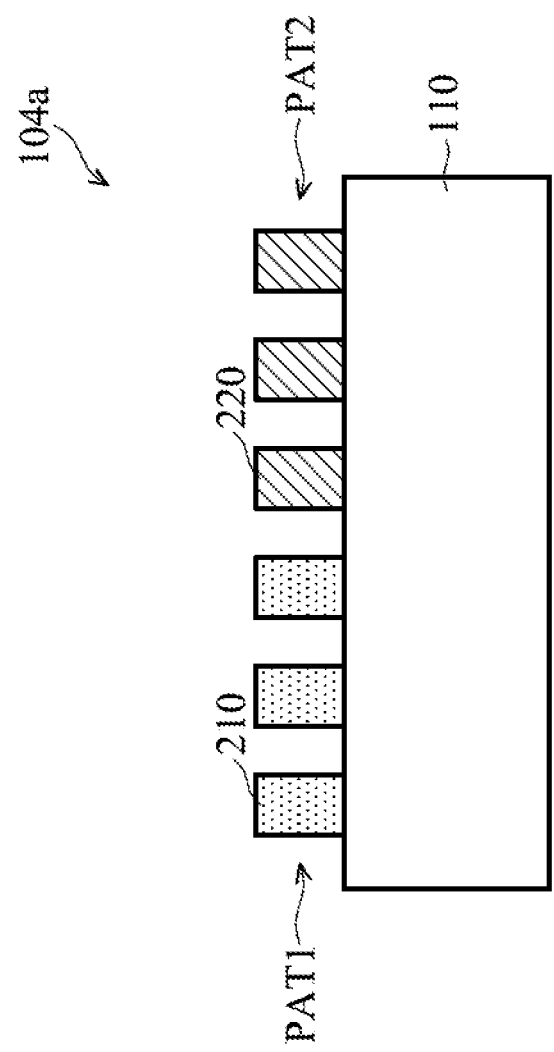
FIG. 3A shows a sectional view of the metrology target of FIG. 2 along the line A-AA, in accordance with some embodiments of the disclosure.

FIG. 3A shows a sectional view of the metrology target 104a of FIG. 2 along the line A-AA, in accordance with some embodiments of the disclosure. The photonic crystals 210 and the photonic crystals 220 are formed in a target layer on the semiconductor substrate 110. In some embodiments, multiple layers are arranged between the semiconductor substrate 110 and the metrology target 104a.

Figure 3B:
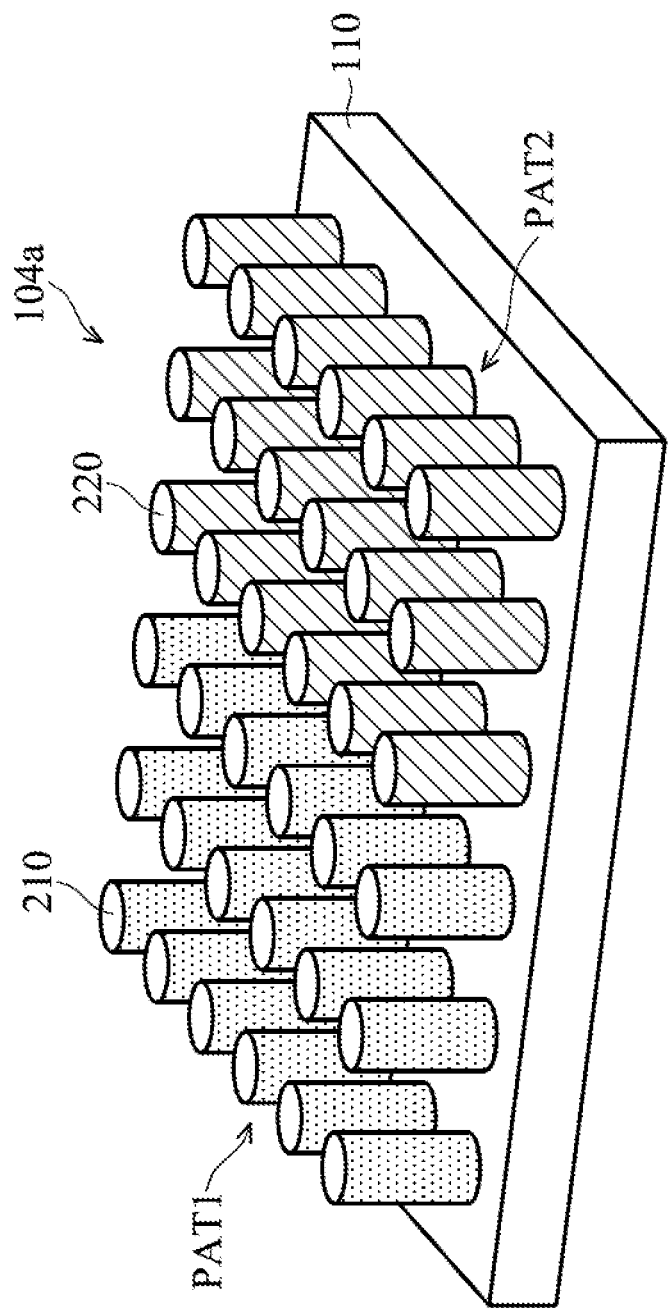
FIG. 3B shows a stereoscopic view of the metrology target of FIG. 2, in accordance with some embodiments of the disclosure.

FIG. 3B shows a stereoscopic view of the metrology target 104a of FIG. 2, in accordance with some embodiments of the disclosure. The photonic crystals 210 and 220 are the circular pillars formed of the same material in the target layer. In some embodiments, the photonic crystals 210 and 220 are formed by different materials in the target layer. Furthermore, the photonic crystals 210 and 220 form a photonic crystalline structure. In order to simplify the description, the features other than the photonic crystals 210 and 220 will be omitted from the target layer. Furthermore, the pillars of the photonic crystals 210 are electrically insulated from each other, and the pillars of the photonic crystals 210 also electrically insulated from the pillars of the photonic crystals 220.

Fabricating processes of photonic crystalline structures have developed in recent years due to nanotechnology developments. A photonic crystalline structure is a special periodic array. When light rays incident into a photonic crystalline structure, a photonic band gap phenomenon occurs. Specifically, a photonic crystalline structure may totally reflect light rays with a specific wavelength, and light rays with other wavelengths may penetrate the photonic crystalline structure. The total-reflection wavelength is defined as a wavelength that occurs due to the photonic band gap phenomenon.

Figure 4:
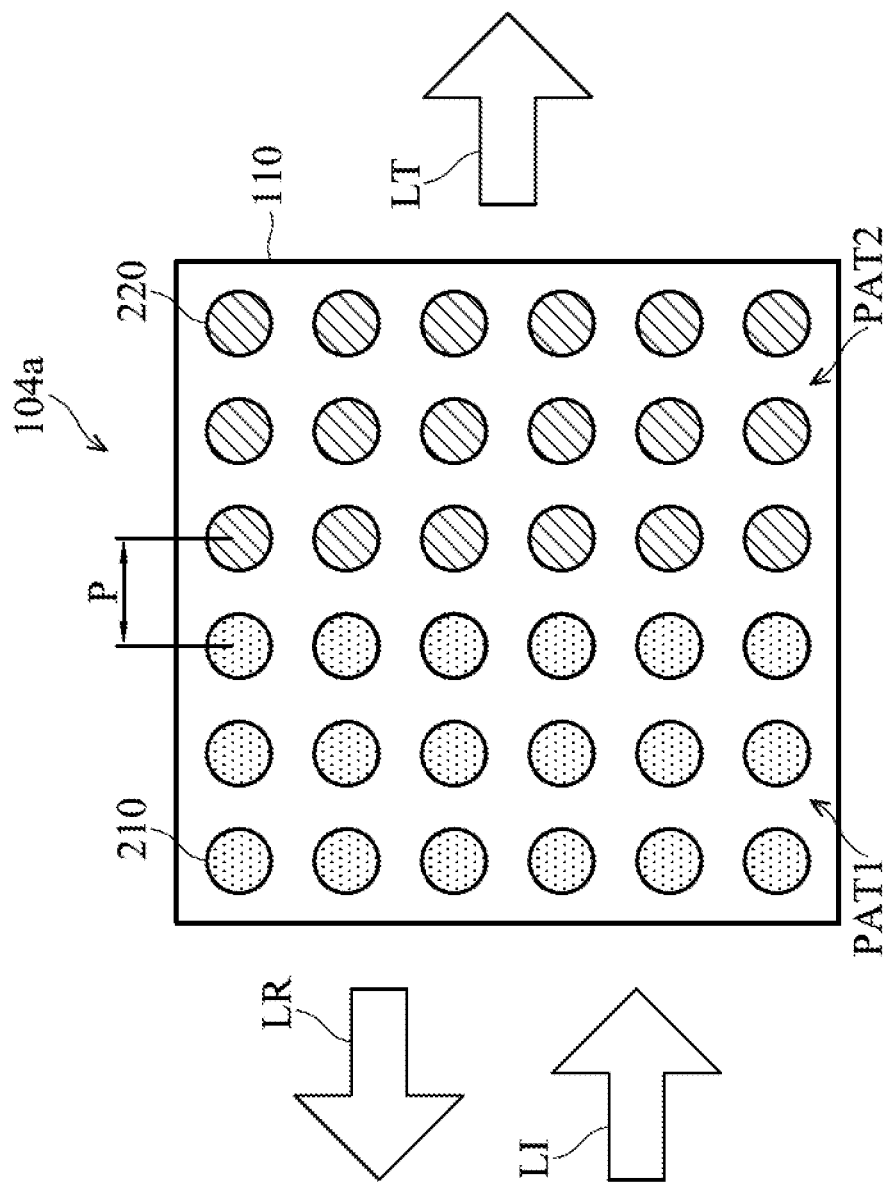
FIG. 4 shows a schematic illustrating the input light LI, the reflected light LR, and the transmitted light LT of the metrology target of FIG. 2, in accordance with some embodiments of the disclosure.

FIG. 4 shows a schematic illustrating the input light LI, the reflected light LR, and the transmitted light LT of the metrology target 104a of FIG. 2, in accordance with some embodiments of the disclosure. As described above, the input light LI is provided to the metrology target 104a by the optical device 102 of FIG. 1. The arrangement of the first pattern PAT1 and the second pattern PAT2 can reflect the light with a specific wavelength, and then the reflected light LR is obtained by the light detection device 105B. Simultaneously, the light without the specific wavelength can penetrate the first pattern PAT1 and the second pattern PAT2, and then the transmitted light LT is obtained by the light detection device 105A.

Figure 5A:
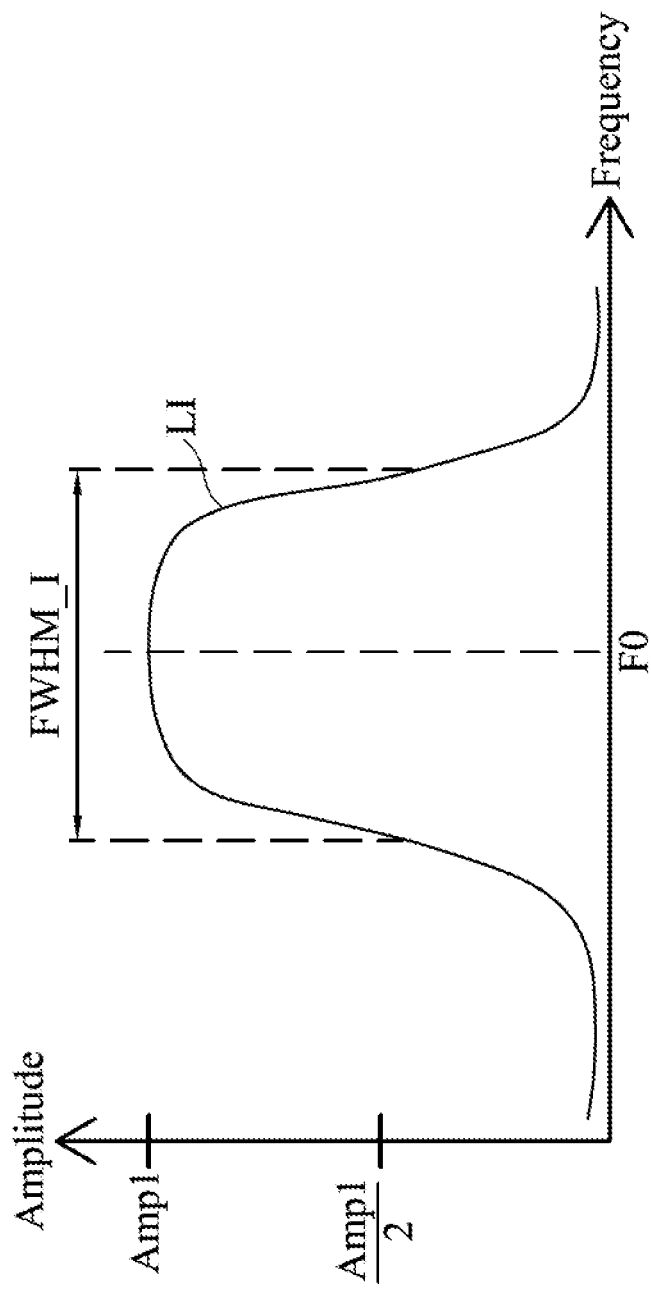
FIG. 5A shows an optical spectrum of the input light LI of FIG. 4.

FIG. 5A shows an optical spectrum of the input light LI of FIG. 4. In FIG. 5A, the input light LI has a center wavelength F0 with a full width at half maximum (FWHM) FWHM_I. In such embodiments, FWHM_I represents the width of a spectrum curve measured between those points on the y-axis which are half the maximum amplitude Amp1 of the transmitted light LT.

Figure 5B:
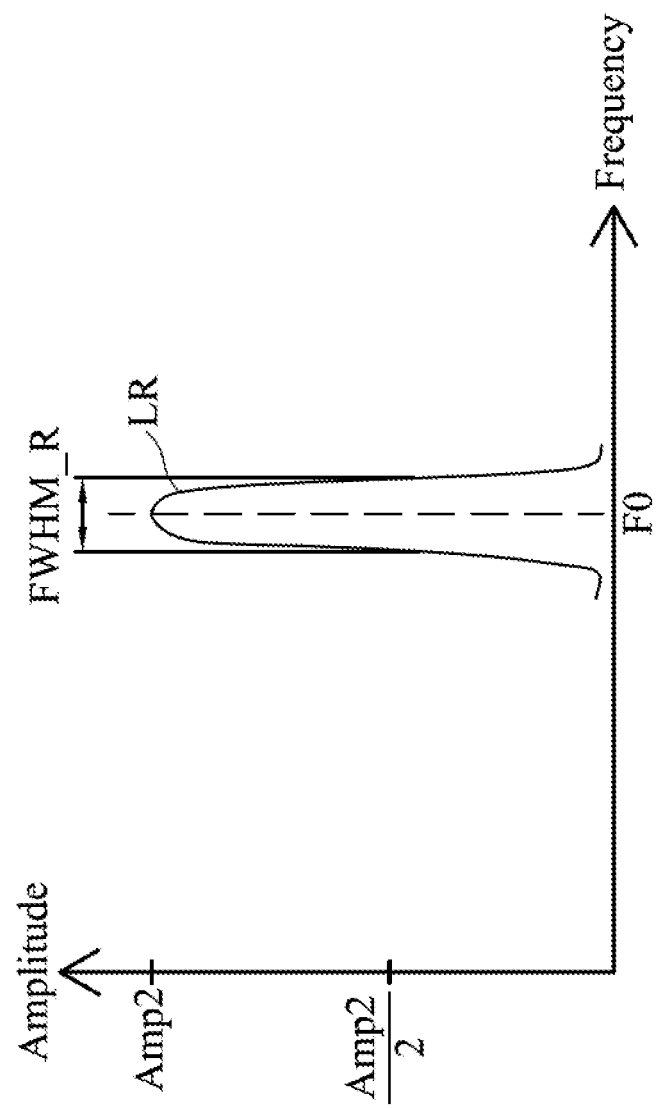
FIG. 5B shows an optical spectrum of the reflected light LR of FIG. 4.

FIG. 5B shows an optical spectrum of the reflected light LR of FIG. 4. In some embodiments, the information regarding the optical spectrum of the reflected light LR is obtained by the light detection device 105B. In FIG. 5B, the reflected light LR has a center wavelength F0 with a FWHM FWHM_R. Specifically, light with the center wavelength F0 is reflected by the photonic crystals 210 and 220 of the metrology target 104a. Furthermore, the FWHM FWHM_R of the reflected light LR is smaller than the FWHM FWHM_I of the input light LI. In such embodiments, FWHM_R represents the width of a spectrum curve measured between those points on the y-axis which are half the maximum amplitude Amp2 of the reflected light LR.

FIG. 5C shows an optical spectrum of the transmitted light LT of FIG. 4. In some embodiments, the information regarding the optical spectrum of the transmitted light LT is obtained by the light detection device 105A. In FIG. 5C, the transmitted light LT does not include the light with the center wavelength F0. Specifically, the light without the wavelength F0 can penetrate the first pattern PAT1 and the second pattern PAT2 of the metrology target 104a.

As described above, according to the data from the light detection device 105A and/or the light detection device 105B, the processor 106 can analyze the data to determine the overlay-shift between the photonic crystals 210 of the first pattern PAT1 and the photonic crystals 220 of the second pattern PAT2.

FIGS. 6A-6G show cross-sectional representations of various stages of forming the metrology target 104a of FIG. 3A, in accordance with some embodiments of the disclosure.

Referring to FIG. 6A, a substrate 110 is provided. The substrate 110 may be made of silicon or other semiconductor materials. Alternatively or additionally, the substrate 110 may include other elementary semiconductor materials such as germanium. In some embodiments, the substrate 110 is made of a compound semiconductor such as silicon carbide, gallium arsenic, indium arsenide, or indium phosphide. In some embodiments, the substrate 110 is made of an alloy semiconductor such as silicon germanium, silicon germanium carbide, gallium arsenic phosphide, or gallium indium phosphide. In some embodiments, the substrate 110 includes an epitaxial layer. For example, the substrate 110 has an epitaxial layer overlying a bulk semiconductor.

The substrate 110 may include various doped regions such as p-type wells or n-type wells). Doped regions may be doped with p-type dopants, such as boron or $BF_2$, and/or n-type dopants, such as phosphorus (P) or arsenic (As). In some other embodiments, the doped regions may be formed directly on the substrate 110.

The substrate 110 also includes isolation structures (not shown). The isolation structure is used to define and electrically isolate various devices formed in and/or over the substrate 110. In some embodiments, the isolation structure includes shallow trench isolation (STI) structure, local oxidation of silicon (LOCOS) structure, or another applicable isolation structure. In some embodiments, the isolation structure includes silicon oxide, silicon nitride, silicon oxynitride, fluoride-doped silicate glass (FSG), or another suitable material.

Afterwards, a material layer 112 is formed on the substrate 110, and a material layer 114 is formed on the material layer 112. The material layer 112 is designed to form the first pattern PAT1 and the second pattern PAT2 of the metrology target 104a. In some embodiments, the material layer 112 or 114 is a dielectric layer. In some embodiments, the material layer 112 or 114 is a metal layer. In order to form the specific patterns, a first photolithography process is performed. The first photolithography process includes photoresist coating (e.g., spin-on coating), soft baking, layer mask aligning, exposure, post-exposure baking, developing the photoresist, rinsing, drying (e.g., hard baking), or other suitable processes.

After forming the material layer 114, a photoresist layer 116 is formed on the material layer 114. In some embodiments, the photoresist layer 116 is formed by depositing a polymer composition on the material layer 114. In some embodiments, the photoresist layer 116 is a negative photoresist. The negative photoresist is sensitized when exposed to light so that unexposed regions will dissolve in a developer solution leaving behind exposed regions.

In some embodiments, the material layer 112, the material layer 114 and the photoresist layer 116 are independently formed by a deposition process, such as a spin-on coating process, chemical vapor deposition process (CVD), physical vapor deposition (PVD) process, and/or other suitable deposition processes.

A first layer mask 170 is formed over the photoresist layer 116, and an exposure process 172 is performed on the photoresist layer 116. For example, the photoresist layer 116 is exposed to a radiation beam through the first layer mask 170. The first layer mask 170 includes blocking portions that do not allow the radiation beam to pass through.

Next, as shown in FIG. 6B, the pattern of the first layer mask 170 is transferred to the photoresist layer 116. Therefore, the photoresist layer 116 is patterned, and the unexposed regions of the photoresist layer 116 are dissolved. Thus, the exposed regions 116a are formed on the material layer 114.

Afterwards, the material layer 114 is etched by an etching process 174 as shown in FIG. 6C in accordance with some embodiments of the disclosure. The material layer 114 is etched by using the photoresist layer 116 as the first layer mask 170. In some embodiments, the etching process is a dry etching process, such as a plasma etching process.

After the material layer 114 is etched, the unexposed region 116a of the photoresist layer 116 is removed as shown in FIG. 6D in accordance with some embodiments of the disclosure. Afterwards, a photoresist layer 118 is formed on the material layer 112. In some embodiments, the photoresist layer 118 is formed by depositing a polymer composition on the material layer 112. In some embodiments, the photoresist layer 118 is a negative photoresist. The negative photoresist is sensitized when exposed to light so that unexposed regions will dissolve in a developer solution leaving behind exposed regions.

A second layer mask 180 is formed over the photoresist layer 118, and a second photolithography process is performed. For example, an exposure process 176 is performed on the photoresist layer 118, and the photoresist layer 118 is exposed to a radiation beam through the second layer mask 180. The second layer mask 180 includes blocking portions that do not allow the radiation beam to pass through.

Next, as shown in FIG. 6E, the pattern of the second layer mask 180 is transferred to the photoresist layer 118. Therefore, the photoresist layer 118 is patterned, and the unexposed regions of the photoresist layer 118 are dissolved. Thus, the exposed regions 118a are formed on the material layer 112.

Afterwards, the material layer 112 is etched by an etching process 178 as shown in FIG. 6F in accordance with some embodiments of the disclosure. The material layer 112 is etched by using the photoresist layer 118 as the second layer mask 180 and using the material layer 114 as the first layer mask 170.

Next, as shown in FIG. 6G, after the material layer 112 is etched, the exposed region 118a of the photoresist layer 118 and the unetched material layer 114a are removed, and then the metrology target 104a is formed. As described above, the first layer mask 170 and the second layer mask 180 are used in successive patterning steps, and the first layer mask 170 is used in a previous patterning step and the second layer mask 180 is used in a subsequent patterning step.

In the metrology target 104a of FIG. 6G, the photonic crystals 210 and 220 are formed of the same material (e.g., the material of the material layer 112), such as Si, SiN, Cu, or High K material. The photonic crystals 210 are formed by the material layer 112 covered by the unetched material layer 114a, and the photonic crystals 220 are formed by the material layer 112 covered by the exposed region 118a of the photoresist layer 118. Thus, bottoms of the photonic crystals 210 are level with that of the photonic crystals 220, and tops of the photonic crystals 210 are level with that of the photonic crystals 220. In such embodiments, the photonic crystals 210 and 220 have the same height. Furthermore, the first pattern PAT1 formed by the photonic crystals 210 is formed on the substrate 110 according to the first layer mask 170, and the second pattern PAT2 formed by the photonic crystals 220 is formed on the substrate 110 according to the second layer mask 180.

FIGS. 7A-7E show cross-sectional representations of various stages of forming the metrology target 104a of FIG. 3A, in accordance with some embodiments of the disclosure.

Figure 7A:
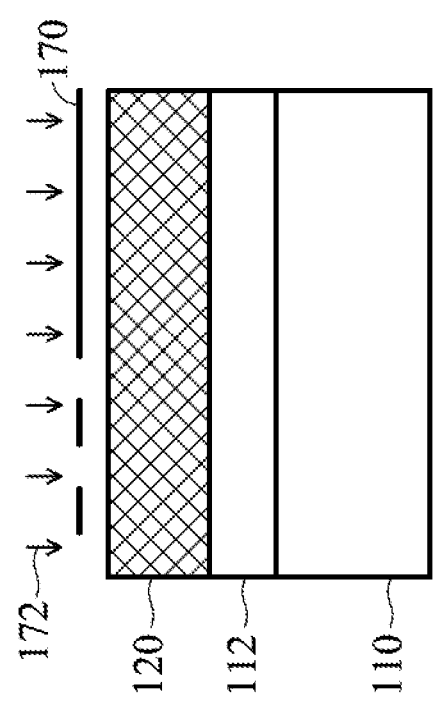
FIGS. 7A-7E show cross-sectional representations of various stages of forming the metrology target of FIG. 3A, in accordance with some embodiments of the disclosure.

Referring to FIG. 7A, a substrate 110 is provided. Afterwards, a material layer 112 is formed on the substrate 110. The material layer 112 is designed to form the first pattern PAT1 and the second pattern PAT2 of the metrology target 104a. In some embodiments, the material layer 112 is a dielectric layer. In some embodiments, the material layer 112 is a metal layer. In order to form the specific patterns, a first photolithography process is performed. The first photolithography process includes photoresist coating (e.g., spin-on coating), soft baking, layer mask aligning, exposure, post-exposure baking, developing the photoresist, rinsing, drying (e.g., hard baking), or other suitable processes.

After forming the material layer 112, a photoresist layer 120 is formed on the material layer 112. In some embodiments, the photoresist layer 120 is formed by depositing a polymer composition on the material layer 112. In some embodiments, the photoresist layer 120 is a negative photoresist. The negative photoresist is sensitized when exposed to light so that unexposed regions will dissolve in a developer solution leaving behind exposed regions.

In some embodiments, the material layer 112 and the photoresist layer 120 are independently formed by a deposition process, such as a spin-on coating process, chemical vapor deposition process (CVD), physical vapor deposition (PVD) process, and/or other suitable deposition processes.

A first layer mask 170 is formed over the photoresist layer 120, and an exposure process 172 is performed on the photoresist layer 120. For example, the photoresist layer 120 is exposed to a radiation beam through the first layer mask 170. The first layer mask 170 includes blocking portions that do not allow the radiation beam to pass through.

Figure 7B:
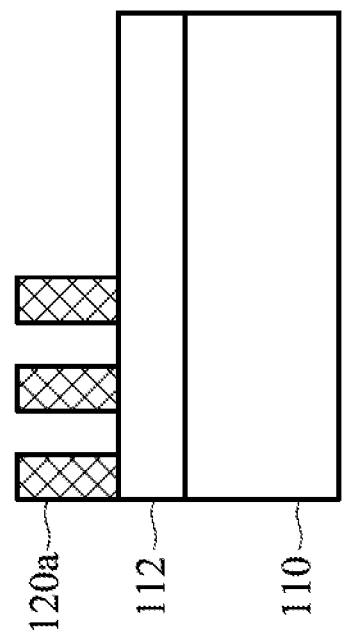

Next, as shown in FIG. 7B, the pattern of the first layer mask 170 is transferred to the photoresist layer 120. Therefore, the photoresist layer 120 is patterned, and the unexposed regions of the photoresist layer 120 are dissolved. Thus, the exposed regions 120a are formed on the material layer 112.

After the unexposed regions of the photoresist layer 120 is dissolved, the exposed regions 120a of the photoresist layer 120 are baked by a heat. The function of baking is to decompose the photoreactive polymer in the photoresist layer 120 and to evaporate solvent. In some embodiments, a post exposure bake (PEB) operation is performed on the exposed regions 120a of the photoresist layer 120.

Figure 7D:
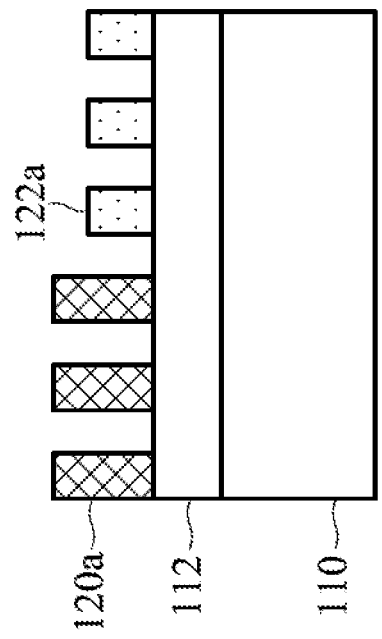
Figure 7C:
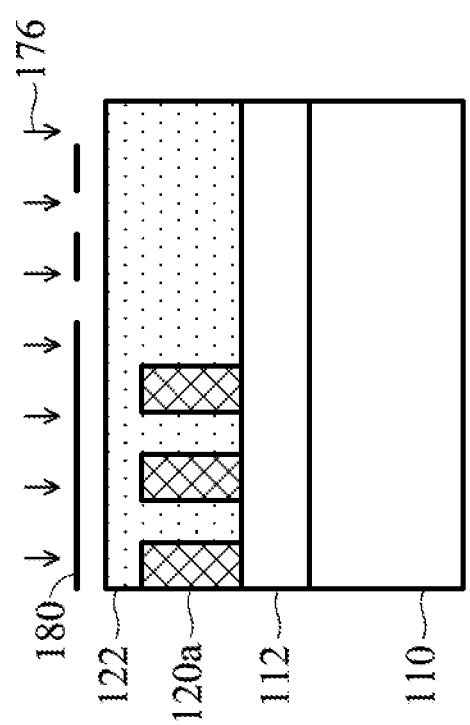

Referring to FIG. 7C, a photoresist layer 122 is formed on the material layer 112, and a second photolithography process is performed. For example, the photoresist layer 122 is exposed to a radiation beam through a second layer mask 180. The second layer mask 180 includes blocking portions that do not allow the radiation beam to pass through.

Next, as shown in FIG. 7D, the pattern of the second layer mask 180 is transferred to the photoresist layer 122. Therefore, the photoresist layer 122 is patterned, and the unexposed regions of the photoresist layer 122 are dissolved. Thus, the exposed regions 122a are formed on the material layer 112.

Figure 7E:
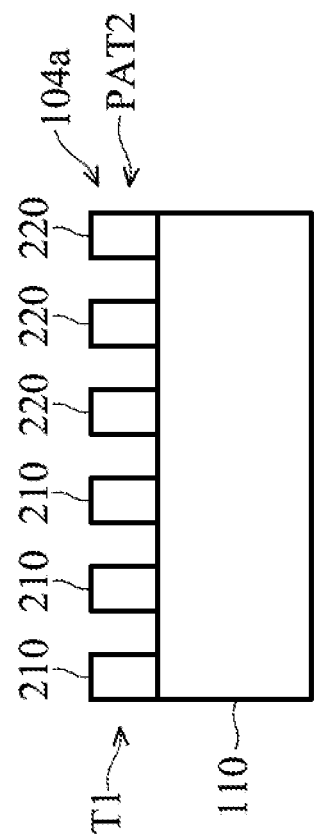

Afterwards, the material layer 112 is etched by an etching process as shown in FIG. 7E in accordance with some embodiments of the disclosure. The material layer 112 is etched by using the photoresist layer 122 as the second layer mask 180 and using the photoresist layer 120 as the first layer mask 170. After the material layer 112 is etched, the exposed region 120a of the photoresist layer 120 and the exposed region 122a of the photoresist layer 122 are removed, and then the metrology target 104a is formed.

In the metrology target 104a of FIG. 7E, the photonic crystals 210 and 220 are formed of the same material (e.g., the material of the material layer 112). The photonic crystals 210 are formed by the material layer 112 covered by the exposed region 120a of the photoresist layer 120, and the photonic crystals 220 are formed by the material layer 112 covered by the exposed region 122a of the photoresist layer 122. Thus, bottoms of the photonic crystals 210 are level with that of the photonic crystals 220. Furthermore, the first pattern PAT1 formed by the photonic crystals 210 is formed on the substrate 110 according to the first layer mask 170, and the second pattern PAT2 formed by the photonic crystals 220 is formed on the substrate 110 according to the second layer mask 180.

In some embodiments, the photonic crystals 210 and 220 are air pillars by etched air holes in the material layer 112. For example, by using the unetched material layer 114a and the exposed region 118a to cover the material layer 112 according to the layer masks complement to the first and second layer masks, and then the material layer 112 is etched to form the air pillars of the photonic crystals 210 and 220.

Figure 8A:
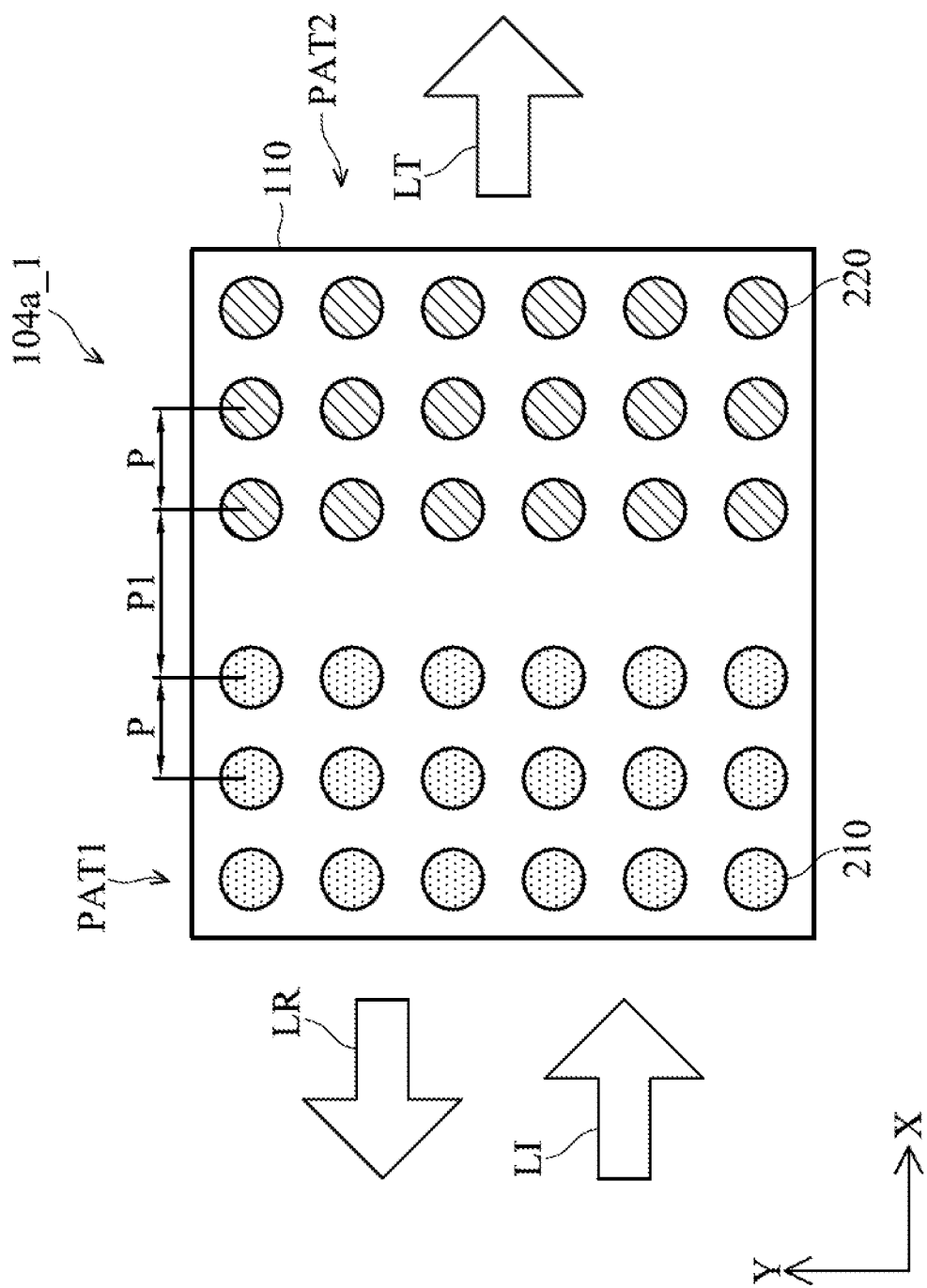
FIG. 8A shows a schematic illustrating the input light LI, the reflected light LR, and the transmitted light LT of a metrology target with overlay-shift.

FIG. 8A shows a schematic illustrating the input light LI, the reflected light LR, and the transmitted light LT of a metrology target 104a_1 with overlay-shift. As described above, the input light LI has a center wavelength F0 with a FWHM_I (as shown in FIG. 5A) is provided to the metrology target 104a_1 by the optical device 102 of FIG. 1. The first pattern PAT1 and the second pattern PAT2 can reflect the light with a specific wavelength, and then the reflected light LR is obtained by the light detection device 105B. Simultaneously, the light without the specific wavelength can penetrate the first pattern PAT1 and the second pattern PAT2, and then the transmitted light LT is obtained by the light detection device 105A.

In the metrology target 104a_1 of FIG. 8A, the photonic crystals 210 of the first pattern PAT1 are arranged in an array with the same pitch P, and the photonic crystals 220 of the second pattern PAT2 are also arranged in an array with the same pitch P. However, the distances P1 between the rightmost photonic crystal 210 of the first pattern PAT1 and the leftmost photonic crystal 220 of the second pattern PAT2 are larger than the pitch P (e.g., P1>P). Thus, an alignment error of the first pattern PAT1 and the second pattern PAT2 is present in the X direction, i.e., the overlay-shift is larger than zero (e.g., OVL>0), and the alignment error of the first and second patterns is caused by a misalignment between the first and second layer masks.

FIG. 8B shows an optical spectrum of the reflected light LR of FIG. 8A. In some embodiments, the information regarding the optical spectrum of the reflected light LR is obtained by the light detection device 105B. In FIG. 8B, the reflected light LR has a center wavelength F1, where F1 is smaller than F0 (e.g., F1<F0). Ideally, if no alignment error of the first pattern PAT1 and the second pattern PAT2 exists, the center wavelength of the reflected light LR is F0. In the metrology target 104a_1, the alignment error of the first pattern PAT1 and the second pattern PAT2 is present due to the distances P1 being greater than the pitch P. Thus, the light with the center wavelength F1 is reflected by the photonic crystals 210 and 220 of the metrology target 104a_1 due to the alignment error of the first pattern PAT1 and the second pattern PAT2. Specifically, the center wavelength of the reflected light LR is changed from F0 to F1, i.e., a center wavelength shift occurs. According to the center wavelength F1 of the reflected light LR, the processor 106 can determine that the overlay-shift between the photonic crystals 210 of the first pattern PAT1 and the photonic crystals 220 of the second pattern PAT2 is present.

FIG. 8C shows an optical spectrum of the transmitted light LT of FIG. 8A. In some embodiments, the information regarding the optical spectrum of the transmitted light LT is obtained by the light detection device 105A. In FIG. 8C, the transmitted light LT does not include the light with the center wavelength F1. Ideally, if no alignment error of the first pattern PAT1 and the second pattern PAT2 exists, the transmitted light LT does not include the light with the center wavelength F0. In the metrology target 104a_1, the alignment error of the first pattern PAT1 and the second pattern PAT2 is present due to the distances P1 being greater than the pitch P. Thus, the light without the wavelength F1 can penetrate the first pattern PAT1 and the second pattern PAT2 of the metrology target 104a_1 due to the alignment error of the first pattern PAT1 and the second pattern PAT2, i.e., a center wavelength shift occurs. According to the wavelength F1 of the transmitted light LT, the processor 106 can determine that the overlay-shift between the photonic crystals 210 of the first pattern PAT1 and the photonic crystals 220 of the second pattern PAT2 is present.

Figure 9A:
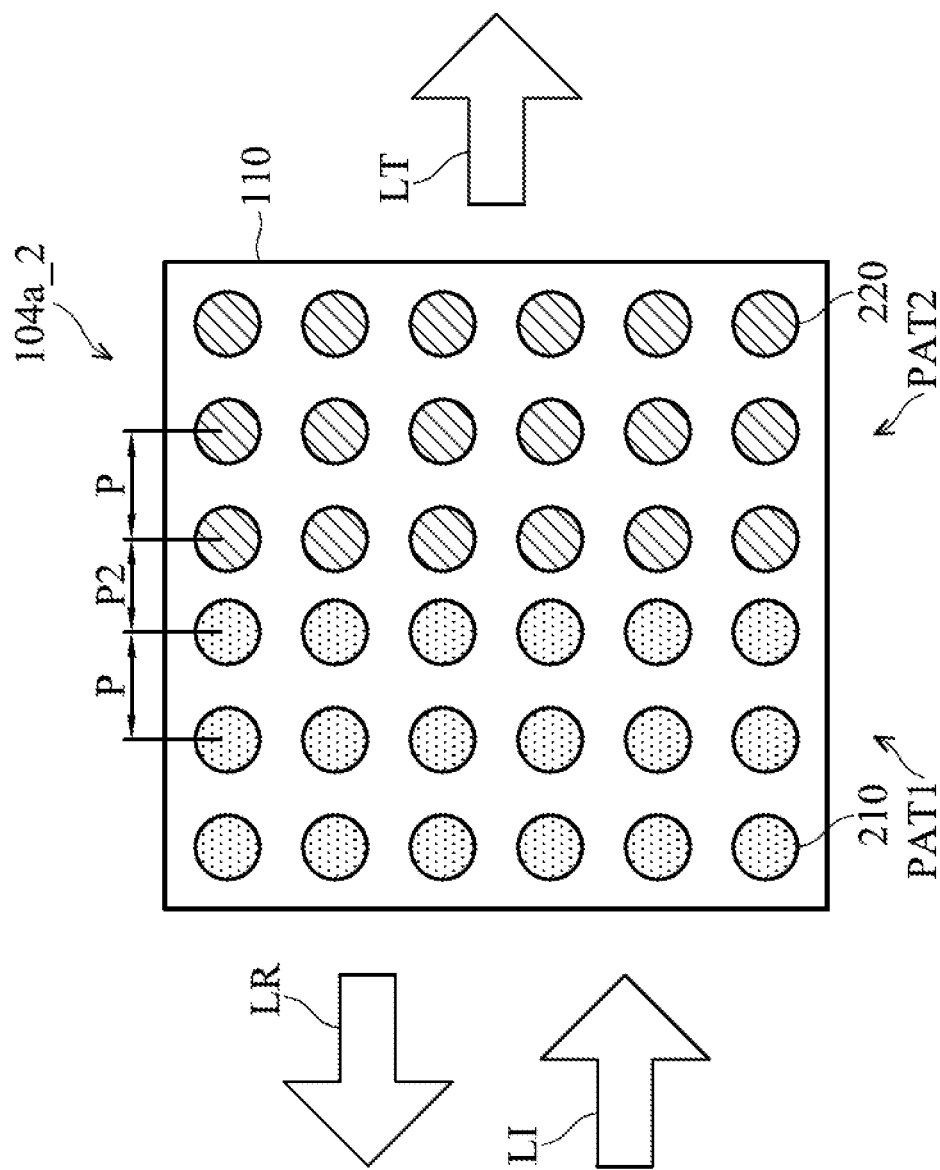
FIG. 9A shows a schematic illustrating the input light LI, the reflected light LR, and the transmitted light LT of a metrology target with overlay-shift.

FIG. 9A shows a schematic illustrating the input light LI, the reflected light LR, and the transmitted light LT of a metrology target 104a_2 with overlay-shift. As described above, the input light LI has a center wavelength F0 with a FWHM_I (as shown in FIG. 5A) is provided to the metrology target 104a_2 by the optical device 102 of FIG. 1. The first pattern PAT1 and the second pattern PAT2 can reflect the light with a specific wavelength, and then the reflected light LR is obtained by the light detection device 105B. Simultaneously, the light without the specific wavelength can penetrate the first pattern PAT1 and the second pattern PAT2, and then the transmitted light LT is obtained by the light detection device 105A.

In the metrology target 104a_2 of FIG. 9A, the photonic crystals 210 of the first pattern PAT1 are arranged in an array with the same pitch P, and the photonic crystals 220 of the second pattern PAT2 are also arranged in an array with the same pitch P. However, the distances P2 between the rightmost photonic crystal 210 of the first pattern PAT1 and the leftmost photonic crystal 220 of the second pattern PAT2 are smaller than the pitch P (e.g., P2<P). Thus, an alignment error of the first pattern PAT1 and the second pattern PAT2 is present in the X direction, i.e., the overlay-shift is smaller than zero (e.g., OVL<0), and the alignment error of the first and second patterns is caused by a misalignment between the first and second layer masks.

FIG. 9B shows an optical spectrum of the reflected light LR of FIG. 9A. In some embodiments, the information regarding the optical spectrum of the reflected light LR is obtained by the light detection device 105B. In FIG. 9B, the reflected light LR has a center wavelength F2, where F2 is larger than F0 (e.g., F2>F0). Ideally, if no alignment error of the first pattern PAT1 and the second pattern PAT2 exists, the center wavelength of the reflected light LR is F0. In the metrology target 104a_2, the alignment error of the first pattern PAT1 and the second pattern PAT2 is present due to the distances P2 being smaller than the pitch P. Thus, light with the center wavelength F2 is reflected by the photonic crystals 210 and 220 of the metrology target 104a_2 due to the alignment error of the first pattern PAT1 and the second pattern PAT2. Specifically, the center wavelength of the reflected light LR is changed from F0 to F2, i.e., a center wavelength shift occurs. According to the center wavelength F2 of the reflected light LR, the processor 106 can determine that the overlay-shift between the photonic crystals 210 of the first pattern PAT1 and the photonic crystals 220 of the second pattern PAT2 is present.

FIG. 9C shows an optical spectrum of the transmitted light LT of FIG. 9A. In some embodiments, the information regarding the optical spectrum of the transmitted light LT is obtained by the light detection device 105A. In FIG. 9C, the transmitted light LT does not include the light with the center wavelength F2. Ideally, if no alignment error of the first pattern PAT1 and the second pattern PAT2 exists, the transmitted light LT does not include the light with the center wavelength F0. In the metrology target 104a_2, the alignment error of the first pattern PAT1 and the second pattern PAT2 is present due to the distances P2 being smaller than the pitch P. Thus, the light without the wavelength F2 can penetrate the first pattern PAT1 and the second pattern PAT2 of the metrology target 104a_2 due to the alignment error of the first pattern PAT1 and the second pattern PAT2, i.e., a center wavelength shift occurs. According to the wavelength F2 of the transmitted light LT, the processor 106 can determine that the overlay-shift between the photonic crystals 210 of the first pattern PAT1 and the photonic crystals 220 of the second pattern PAT2 is present.

Figure 10:
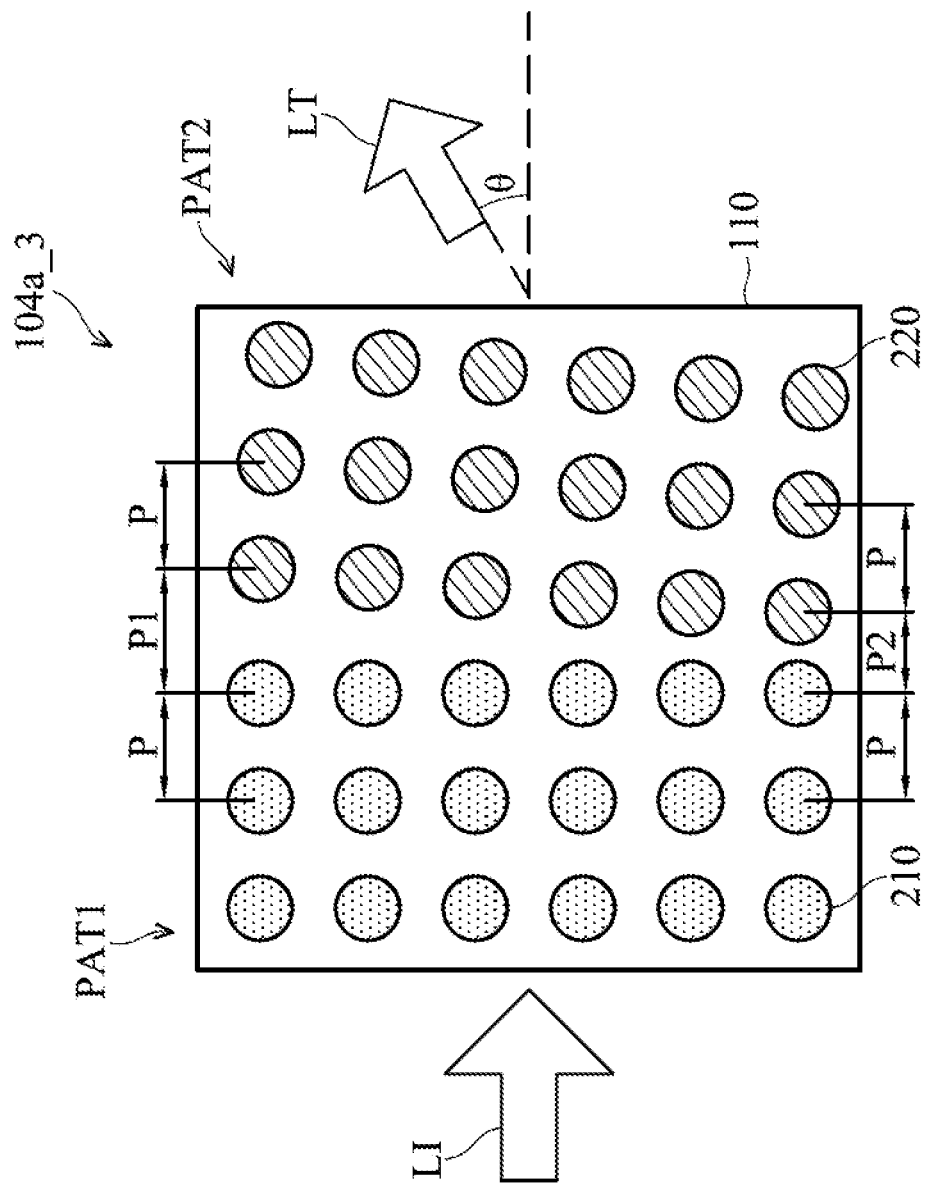
FIG. 10 shows a schematic illustrating the input light LI, and the transmitted light LT of a metrology target with overlay-shift.

FIG. 10 shows a schematic illustrating the input light LI, and the transmitted light LT of a metrology target 104a_3 with overlay-shift. As described above, the input light LI has a center wavelength F0 with a FWHM_I (as shown in FIG. 5A) is provided to the metrology target 104a_3 by the optical device 102 of FIG. 1. In the metrology target 104a_3 of FIG. 10, the photonic crystals 210 of the first pattern PAT1 are arranged in an array with the same pitch P, and the photonic crystals 220 of the second pattern PAT2 are also arranged in an array with the same pitch P. However, the distances P2 between the rightmost photonic crystal 210 of the first pattern PAT1 and the leftmost photonic crystal 220 of the second pattern PAT2 are smaller than the pitch P (e.g., P2<P) in the sixth row. Furthermore, the distances P1 between the rightmost photonic crystal 210 of the first pattern PAT1 and the leftmost photonic crystal 220 of the second pattern PAT2 are larger than the pitch P (e.g., P1>P) in the first row. Specifically, the second pattern PAT2 is tilted, and the transmitted light LT with a scattering angel Θ is received by the light detection device 105A. Thus, an alignment error of the first pattern PAT1 and the second pattern PAT2 is present, i.e., the overlay-shift is not equal to zero (e.g., OVL≠0), and the alignment error of the first and second patterns is caused by a misalignment between the first and second layer masks.

Figure 11A:
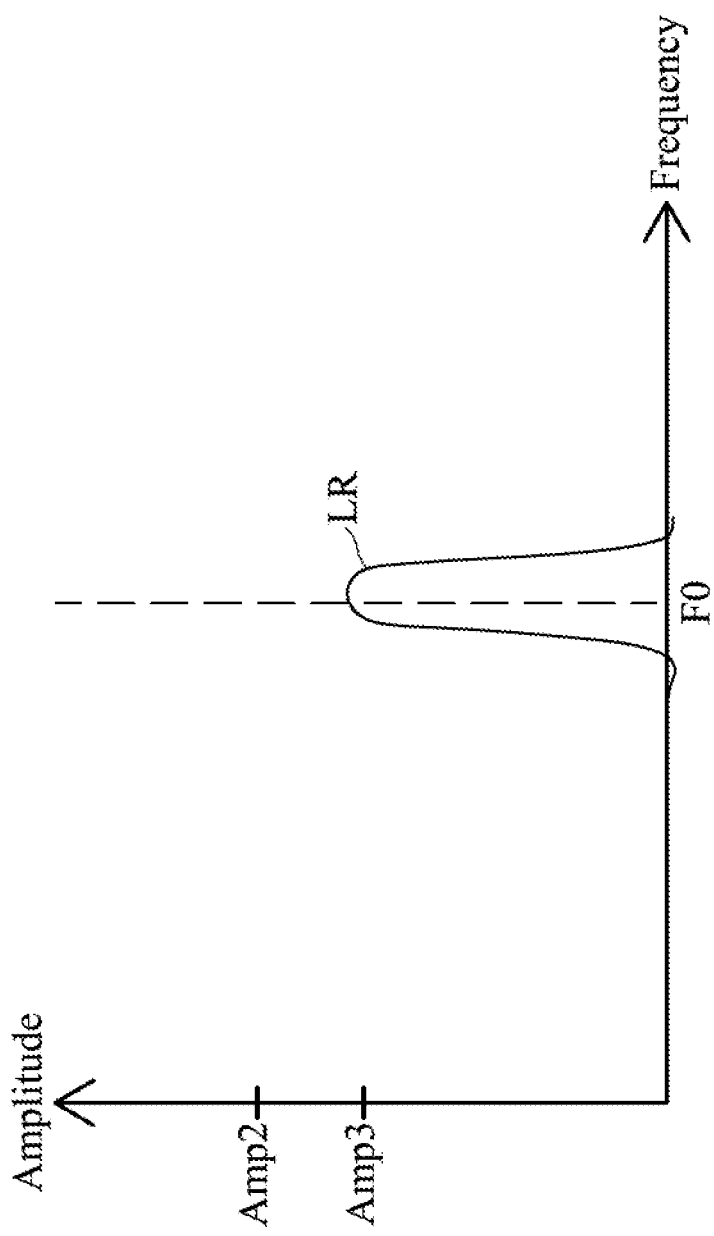
FIG. 11A shows an optical spectrum of a reflected light LR with a decreased center wavelength intensity.

FIG. 11A shows an optical spectrum of a reflected light LR with a decreased center wavelength intensity. As described above, the input light LI has a center wavelength F0 with a FWHM_I (as shown in FIG. 5A) is provided to a metrology target (not shown) by the optical device 102 of FIG. 1. Furthermore, the information regarding the optical spectrum of the reflected light LR is obtained by the light detection device 105B. In FIG. 11A, the reflected light LR has a center wavelength F0, thus no center wavelength shift exists between the reflected light LR and the input light LI. However, compared with the optical spectrum of the reflected light LR of FIG. 5B, the maximum amplitude Amp3 of FIG. 11A is smaller than the maximum amplitude Amp2, thereby the processor 106 can determine that the center wavelength intensity of the reflected light LR is decreased in FIG. 11A. Specifically, according to the change in the center wavelength intensity of the reflected light LR, the processor 106 can determine whether the alignment error of the first pattern PAT1 and the second pattern PAT2 is present (e.g., OVL≠0).

Figure 11B:
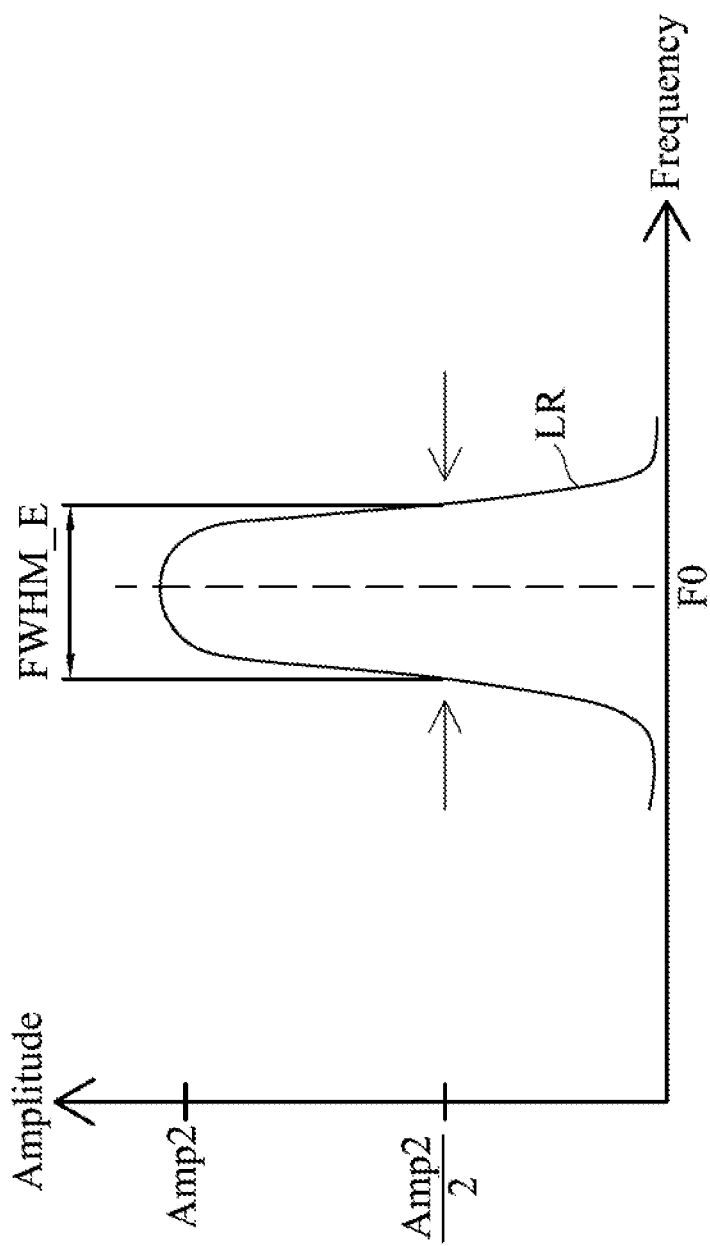
FIG. 11B shows an optical spectrum of a reflected light LR with an increased FWHM.

FIG. 11B shows an optical spectrum of a reflected light LR with an increased FWHM. As described above, the input light LI has a center wavelength F0 with a FWHM_I (as shown in FIG. 5A) is provided to a metrology target (not shown) by the optical device 102 of FIG. 1. Furthermore, the information regarding the optical spectrum of the reflected light LR is obtained by the light detection device 105B. In FIG. 11B, the reflected light LR has a center wavelength F0, thus no center wavelength shift exists between the reflected light LR and the input light LI. Furthermore, the maximum amplitude of the reflected light LR is about Amp2, thereby no change in the center wavelength intensity. However, compared with the optical spectrum of the reflected light LR of FIG. 5B, the FWHM FWHM_E of the reflected light LR of FIG. 11B is greater than the FWHM FWHM_R of the reflected light LR of FIG. 5B, thereby the processor 106 can determine that the FWHM of the reflected light LR is changed in FIG. 11B. Specifically, according to the change in the FWHM of the reflected light LR, the processor 106 can determine whether the alignment error of the first pattern PAT1 and the second pattern PAT2 is present (e.g., OVL≠0).

Figure 11C:
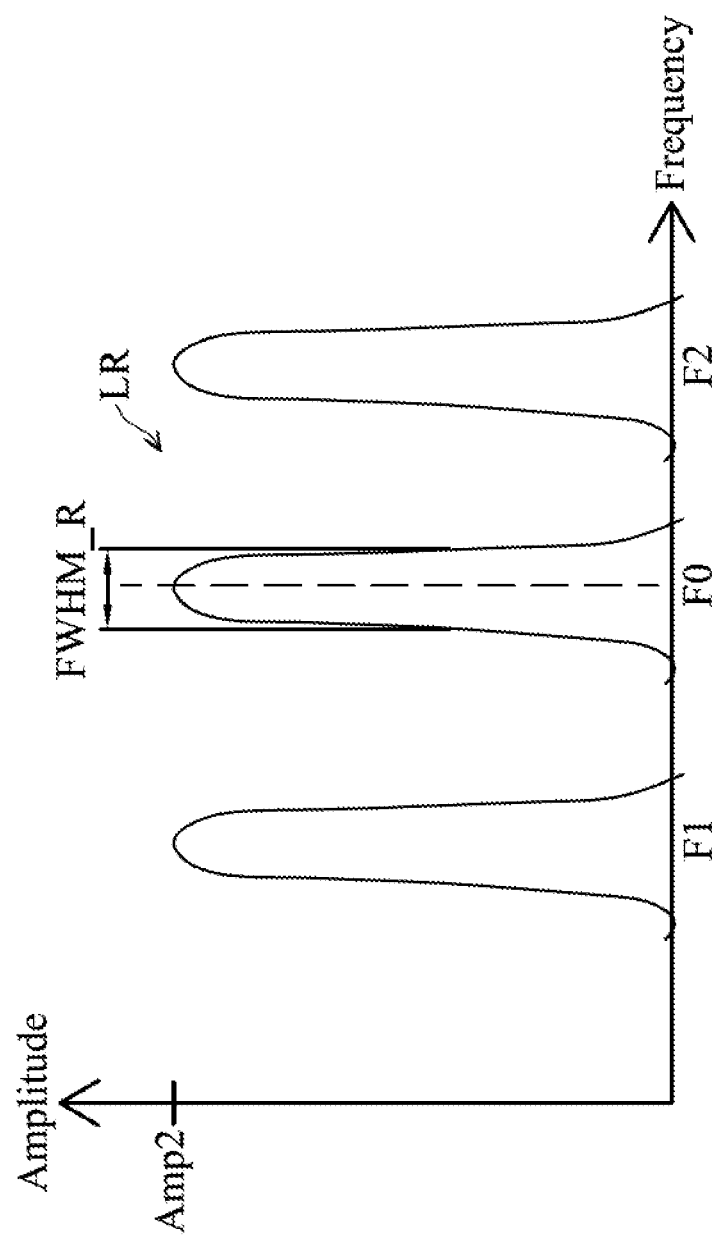
FIG. 11C shows an optical spectrum of a reflected light LR with multiple scattering wavelength.

FIG. 11C shows an optical spectrum of a reflected light LR with multiple scattering wavelength. As described above, the input light LI has a center wavelength F0 with a FWHM_I (as shown in FIG. 5A) is provided to a metrology target (not shown) by the optical device 102 of FIG. 1. Furthermore, the information regarding the optical spectrum of the reflected light LR is obtained by the light detection device 105B. In FIG. 11C, the reflected light LR has a center wavelength F0, thus no center wavelength shift exists between the reflected light LR and the input light LI. Furthermore, the maximum amplitude of the reflected light LR is about Amp2, thereby no change in the center wavelength intensity. Moreover, the FWHM of the reflected light LR of FIG. 11C is about FWHM_R, thereby no change in the FWHM. However, compared with the optical spectrum of the reflected light LR of FIG. 5B, the reflected light LR further has the center wavelengths F1 and F2, thereby the processor 106 can determine that the scattering wavelength count is increased in FIG. 11C. Specifically, according to the change in the scattering wavelength count of the reflected light LR, the processor 106 can determine whether an alignment error of the first pattern PAT1 and the second pattern PAT2 is present (e.g., OVL≠0).

FIGS. 12A-12G show top views of various metrology targets, in accordance with some embodiments of the disclosure. The types of the metrology targets include crisscross-type, cluster-type, and combo-type for the photonic crystalline structures.

In the crisscross-type photonic crystalline structure, the first pattern PAT1 and the second pattern PAT2 are arranged to cross in one direction or multi-directions, or to crisscross with each other.

In the cluster-type photonic crystalline structure, the first pattern PAT1 and the second pattern PAT2 are arranged in different sides for the metrology target.

In the combo-type photonic crystalline structure, the first pattern PAT1 and the second pattern PAT2 are arranged according to the combination of the cluster-type and the crisscross-type.

Figure 12A:
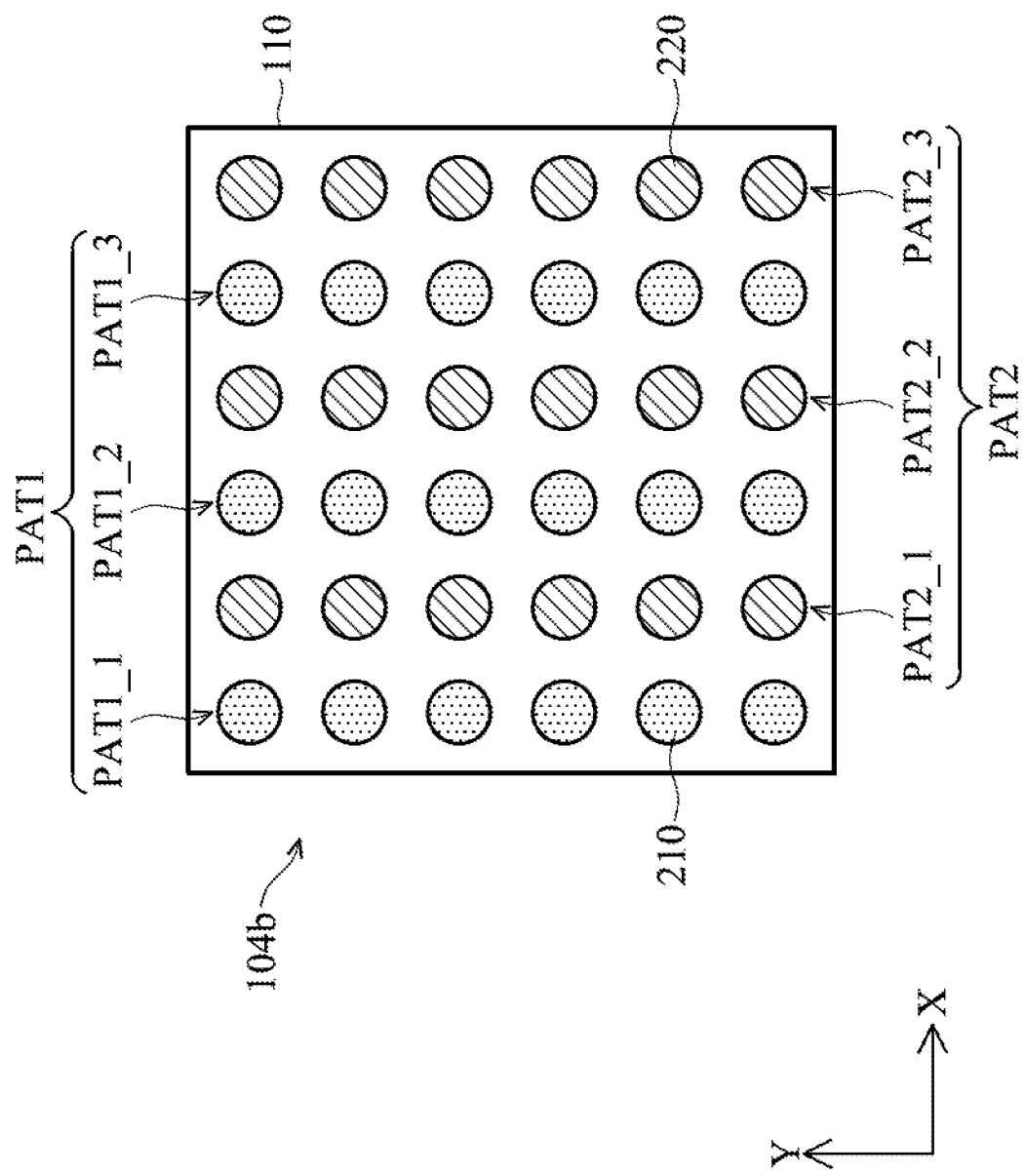

Referring to FIG. 12A, a top view of a metrology target 104b is shown. The metrology target 104b is a crisscross-type or combo-type photonic crystalline structure, and includes a first pattern PAT1 formed by multiple photonic crystals 210 and a second pattern PAT2 formed by multiple photonic crystals 220. The first pattern PAT1 is divided into the first sub-patterns PAT1_1 through PAT1_3, and the second pattern PAT2 is divided into the second sub-patterns PAT2_1 through PAT2_3.

The number of photonic crystals 220 of each of the second sub-patterns PAT2_1 through PAT2_3 is equal to the number of photonic crystals 210 of each of the first sub-patterns PAT1_1 through PAT1_3. The first sub-patterns PAT1_1 through PAT1_3 and the second sub-patterns PAT2_1 through PAT2_3 are interlaced and parallel to a Y direction. For example, in the metrology target 104b, the photonic crystals 210 of the first sub-pattern PAT1_1 are arranged in a first column, the photonic crystals 220 of the second sub-patterns PAT2_1 are arranged in a second column, the photonic crystals 210 of the first sub-patterns PAT1_2 are arranged in a third column, the photonic crystals 220 of the second sub-patterns PAT2_2 are arranged in a fourth column, the photonic crystals 210 of the first sub-patterns PAT1_3 are arranged in a fifth column, and the photonic crystals 220 of the second sub-patterns PAT2_3 are arranged in a sixth column. Thus, the first sub-pattern may be surrounded by the two adjacent second sub-patterns, and the second sub-pattern may be surrounded by the two adjacent first sub-patterns. For example, the first sub-pattern PAT1_2 is surrounded by the two adjacent second sub-patterns PAT2_1 and PAT2_2, and the second sub-pattern PAT2_2 is surrounded by the two adjacent first sub-patterns PAT1_2 and PAT1_3.

Figure 12B:
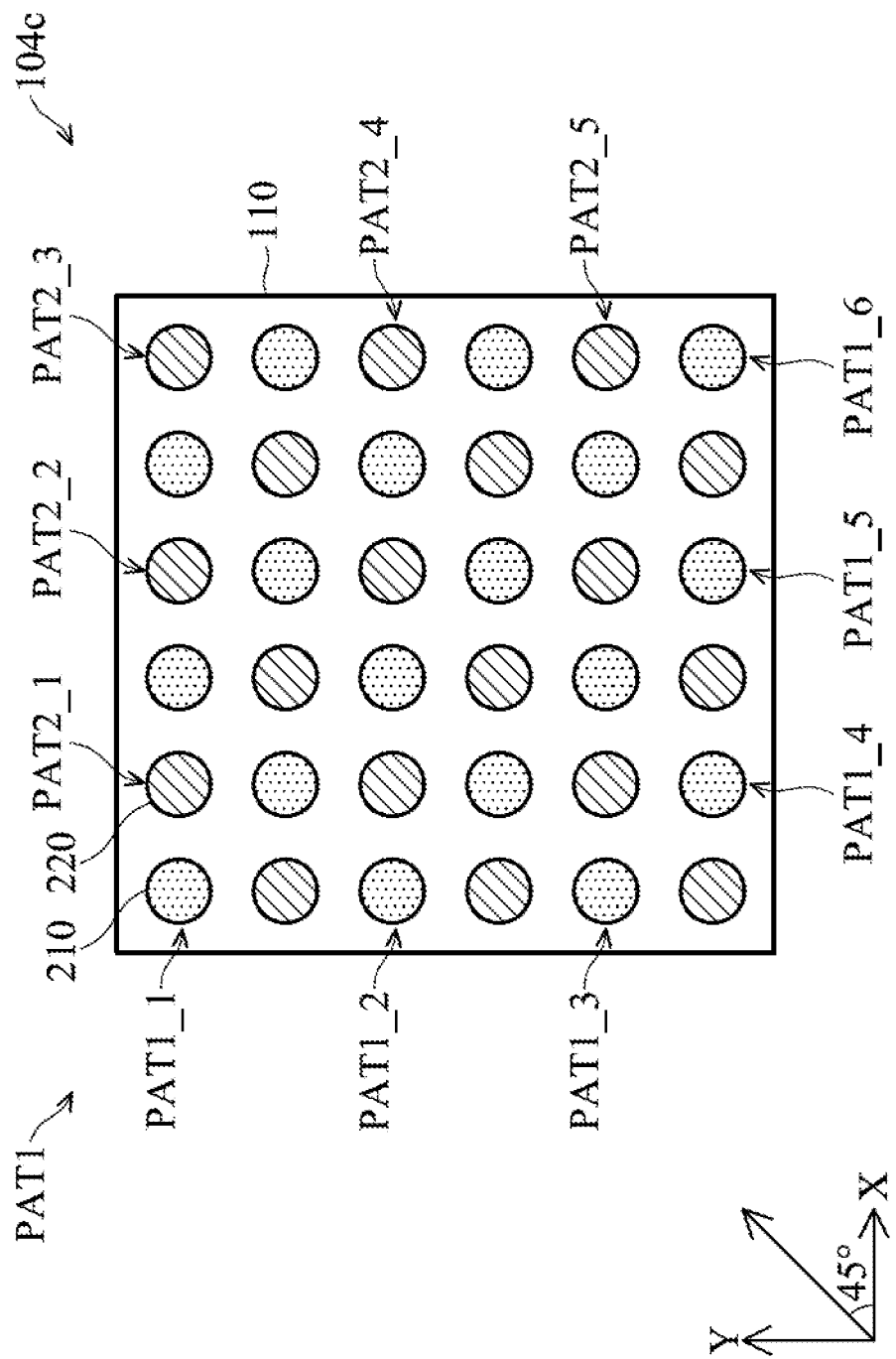

Referring to FIG. 12B, a top view of a metrology target 104c is shown. The metrology target 104c is a crisscross-type photonic crystalline structure, and includes a first pattern PAT1 formed by multiple photonic crystals 210 and a second pattern PAT2 formed by multiple photonic crystals 220. The first pattern PAT1 is divided into the first sub-patterns PAT1_1 through PAT1_5, and the second pattern PAT2 is divided into the second sub-patterns PAT2_1 through PAT2_5. The first sub-patterns PAT1_1 through PAT1_3 and the second sub-patterns PAT2_1 through PAT2_3 are interlaced and parallel to 45 degrees. Thus, the first sub-pattern may be surrounded by the two adjacent second sub-patterns, and the second sub-pattern may be surrounded by the two adjacent first sub-patterns. For example, the first sub-pattern PAT1_3 is surrounded by the two adjacent second sub-patterns PAT2_2 and PAT2_3, and the second sub-pattern PAT2_3 is surrounded by the two adjacent first sub-patterns PAT1_3 and PAT1_4. Furthermore, each photonic crystal 210 of the first pattern PAT1 is surrounded by photonic crystals 220 of the second pattern PAT2, and each photonic crystal 220 of the second pattern PAT2 is surrounded by photonic crystals 210 of the second pattern PAT1.

Figure 12C:
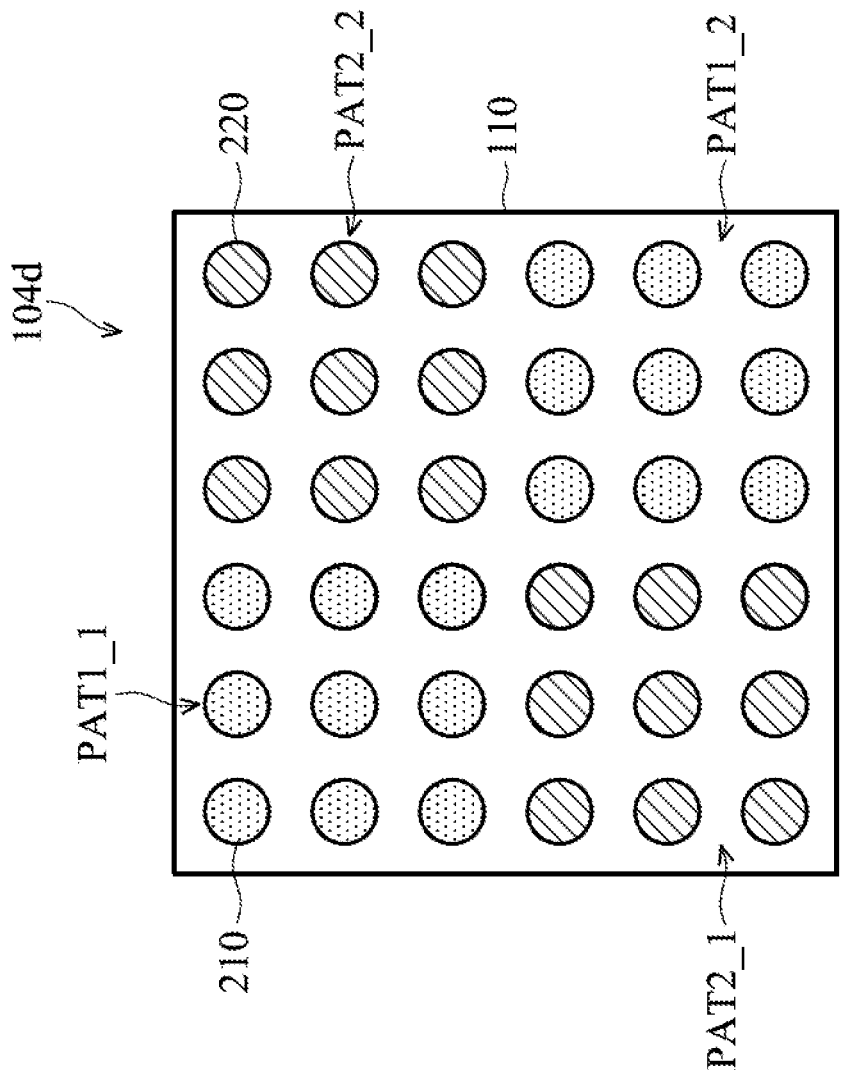

Referring to FIG. 12C, a top view of a metrology target 104d is shown. The metrology target 104d is a cluster-type photonic crystalline structure, and includes a first pattern PAT1 formed by multiple photonic crystals 210 and a second pattern PAT2 formed by multiple photonic crystals 220. The first pattern PAT1 is divided into the first sub-patterns PAT1_1 and PAT1_2, and the second pattern PAT2 is divided into the second sub-patterns PAT2_1 and PAT2_2. The first sub-patterns PAT1_1 and PAT1_2 and the second sub-patterns PAT2_1 and PAT2_2 are arranged at different sides of the metrology target 104d. For example, the first sub-patterns PAT1_1 and PAT1_2 are arranged at the top left side and the bottom right side of the metrology target 104d, respectively. Furthermore, the second sub-patterns PAT2_1 and PAT2_2 are arranged at the bottom left side and the top right side of the metrology target 104d, respectively.

Figure 12D:
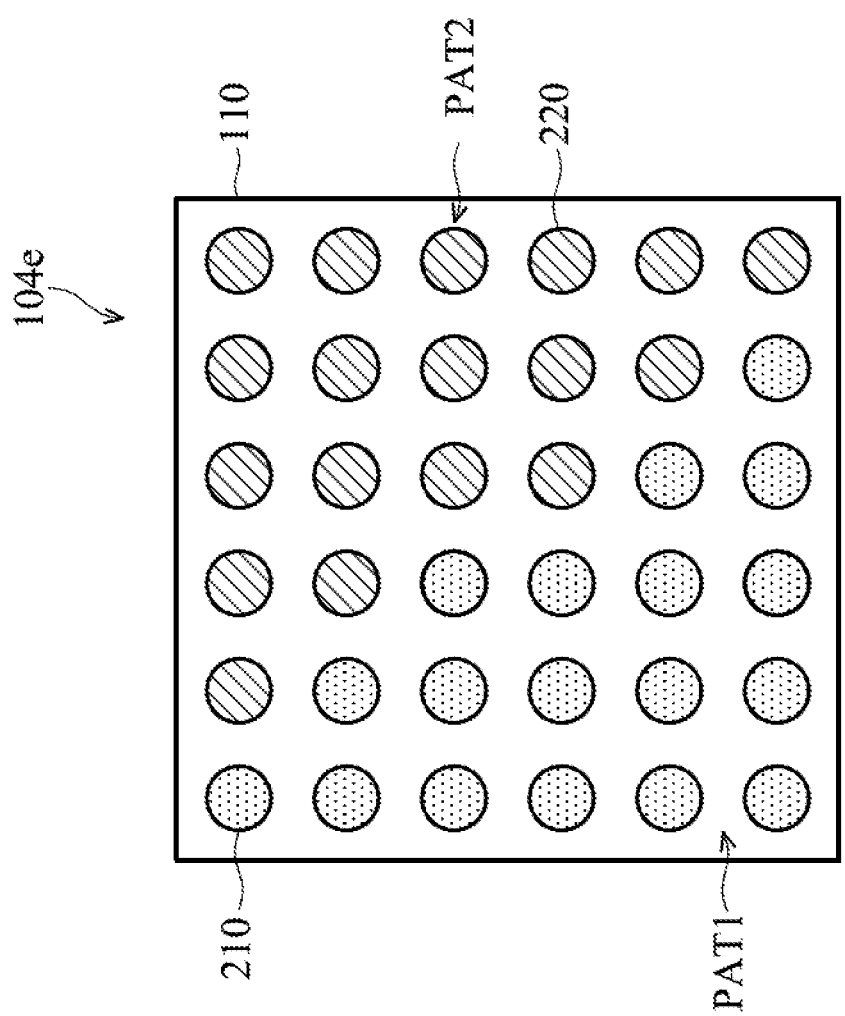

Referring to FIG. 12D, a top view of a metrology target 104e is shown. The metrology target 104e is a cluster-type photonic crystalline structure, and includes a first pattern PAT1 formed by multiple photonic crystals 210 and a second pattern PAT2 formed by multiple photonic crystals 220. The first pattern PAT1 and the second pattern PAT2 are arranged at the bottom left side and the top right side of the metrology target 104e, respectively.

Figure 12E:
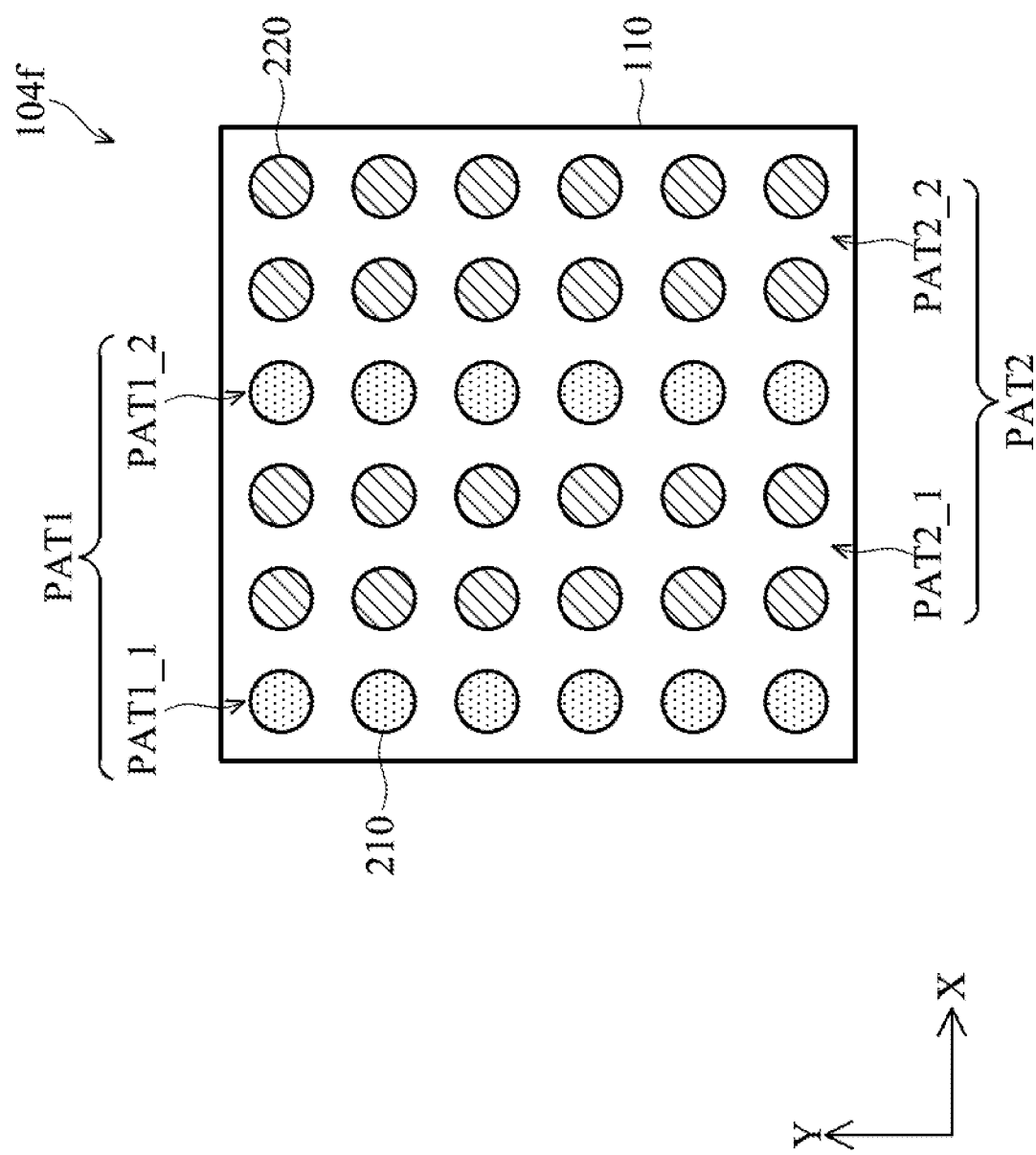

Referring to FIG. 12E, a top view of a metrology target 104f is shown. The metrology target 104f is a combo-type photonic crystalline structure, and includes a first pattern PAT1 formed by multiple photonic crystals 210 and a second pattern PAT2 formed by multiple photonic crystals 220. The first pattern PAT1 is divided into the first sub-patterns PAT1_1 and PAT1_2, and the second pattern PAT2 is divided into the second sub-patterns PAT2_1 and PAT2_2. The number of photonic crystals 220 of each of the second sub-patterns PAT2_1 and PAT2_2 is greater than the number of photonic crystals 210 of each of the first sub-patterns PAT1_1 and PAT1_2. For example, the photonic crystals 210 of each of the first sub-patterns PAT1_1 and PAT1_2 are arranged in a single column, and the photonic crystals 220 of each of the second sub-patterns PAT2_1 and PAT2_2 are arranged in dual columns. The first sub-patterns PAT1_1 and PAT1_2 and the second sub-patterns PAT2_1 and PAT2_2 are interlaced and parallel to a Y direction. For example, in the metrology target 104f, the photonic crystals 210 of the first sub-pattern PAT1_1 are arranged in the first column, the photonic crystals 220 of the second sub-patterns PAT2_1 are arranged in the second and third columns, the photonic crystals 210 of the first sub-patterns PAT1_2 are arranged in the fourth column, and the photonic crystals 220 of the second sub-patterns PAT2_2 are arranged in the fifth and sixth columns. Thus, the first sub-pattern may be surrounded by the two adjacent second sub-patterns, and the second sub-pattern may be surrounded by the two adjacent first sub-patterns. For example, the first sub-pattern PAT1_2 is surrounded by the two adjacent second sub-patterns PAT2_1 and PAT2_2, and the second sub-pattern PAT2_1 is surrounded by the two adjacent first sub-patterns PAT1_1 and PAT1_2.

Figure 12F:
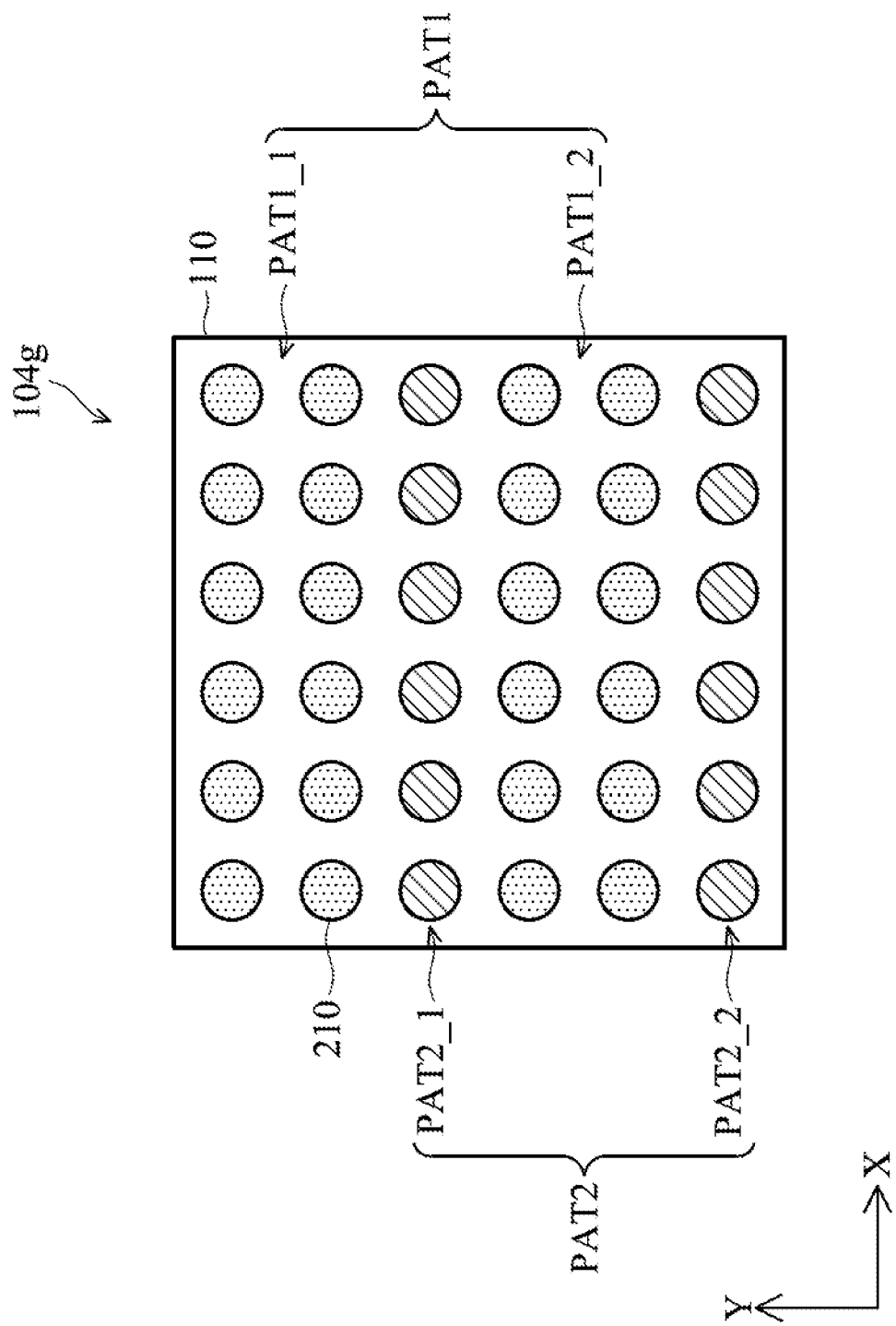

Referring to FIG. 12F, a top view of a metrology target 104g is shown. The metrology target 104g is a combo-type photonic crystalline structure, and includes a first pattern PAT1 formed by multiple photonic crystals 210 and a second pattern PAT2 formed by multiple photonic crystals 220. The first pattern PAT1 is divided into the first sub-patterns PAT1_1 and PAT1_2, and the second pattern PAT2 is divided into the second sub-patterns PAT2_1 and PAT2_2. The number of photonic crystals 210 of each of the first sub-patterns PAT1_1 and PAT1_2 is greater than the number of photonic crystals 220 of each of the second sub-patterns PAT2_1 and PAT2_2. For example, the photonic crystals 210 of each of the first sub-patterns PAT1_1 and PAT1_2 are arranged in dual rows, and the photonic crystals 220 of each of the second sub-patterns PAT2_1 and PAT2_2 are arranged in single row. The first sub-patterns PAT1_1 and PAT1_2 and the second sub-patterns PAT2_1 and PAT2_2 are interlaced and parallel to an X direction. For example, in the metrology target 104g, the photonic crystals 210 of the first sub-pattern PAT1_1 are arranged in the first and second rows, the photonic crystals 220 of the second sub-patterns PAT2_1 are arranged in the third row, the photonic crystals 210 of the first sub-patterns PAT1_2 are arranged in the fourth and fifth rows, and the photonic crystals 220 of the second sub-patterns PAT2_2 are arranged in the sixth row. Thus, the first sub-pattern may be surrounded by the two adjacent second sub-patterns, and the second sub-pattern may be surrounded by the two adjacent first sub-patterns. For example, the first sub-pattern PAT1_2 is surrounded by the two adjacent second sub-patterns PAT2_1 and PAT2_2, and the second sub-pattern PAT2_1 is surrounded by the two adjacent first sub-patterns PAT1_1 and PAT1_2.

Referring to FIG. 12G, a top view of a metrology target 104h is shown. The metrology target 104h is a crisscross-type photonic crystalline structure, and includes a first pattern PAT1 formed by multiple photonic crystals 210 and a second pattern PAT2 formed by multiple photonic crystals 220. The first pattern PAT1 is divided into the first sub-patterns PAT1_1 through PAT1_3, and the second pattern PAT2 is divided into the second sub-patterns PAT2_1 and PAT2_2. The photonic crystals 210 of each of the first sub-patterns PAT1_1 through PAT1_3 form the individual rings. The number of photonic crystals 210 of the first sub-pattern PAT1_1 is greater than that of the first sub-pattern PAT1_2, and the number of photonic crystals 210 of the first sub-pattern PAT1_2 is greater than that of the first sub-pattern PAT1_3. Furthermore, the photonic crystals 220 of each of the second sub-patterns PAT2_1 and PAT2_2 form the individual rings. The number of photonic crystals 220 of the second sub-pattern PAT2_1 is greater than that of the second sub-pattern PAT2_2. The first sub-pattern may be surrounded by the two adjacent second sub-patterns, and the second sub-pattern may be surrounded by the two adjacent first sub-patterns. For example, in the metrology target 104h, the ring formed by the photonic crystals 220 of the second sub-pattern PAT2_1 is surrounded by the rings formed by the photonic crystals 210 of the first sub-pattern PAT1_1 and PAT1_2. Furthermore, the ring formed by the photonic crystals 210 of the first sub-pattern PAT1_2 is surrounded by the rings formed by the photonic crystals 220 of the second sub-pattern PAT2_1 and PAT2_2.

Figure 13:
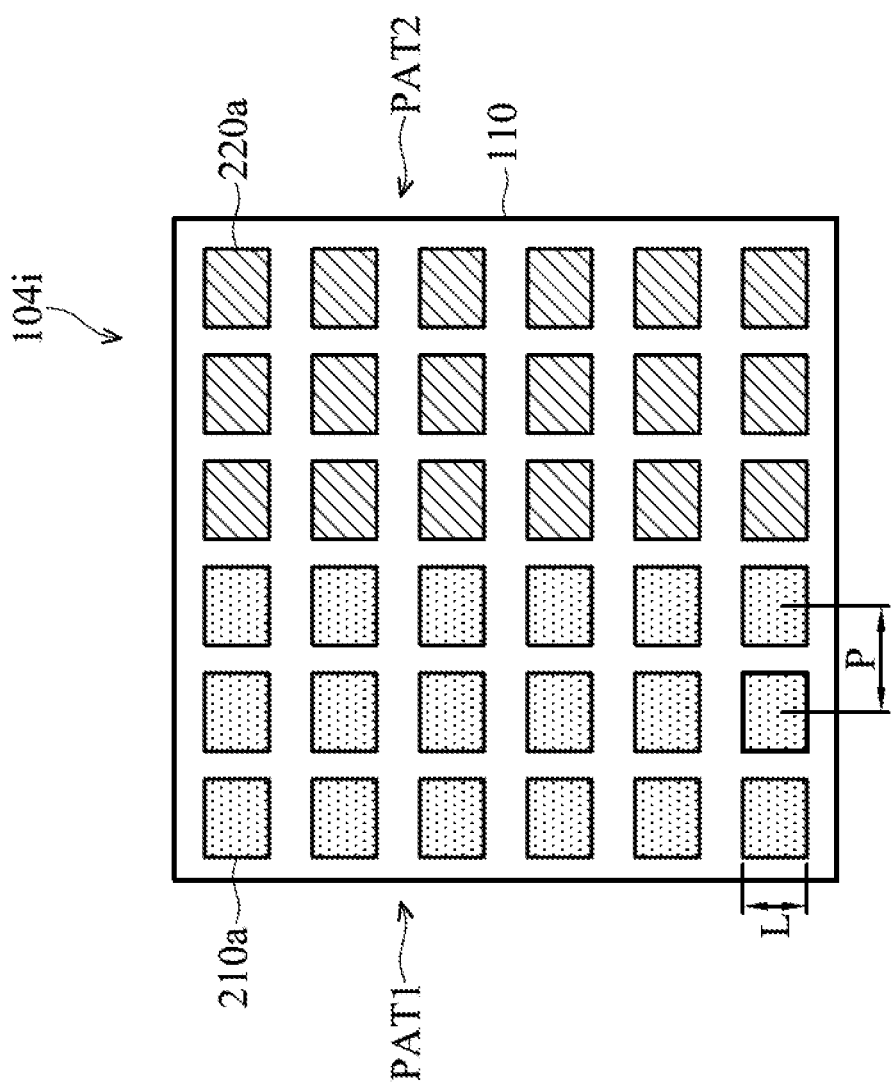
FIG. 13 shows a top view of a metrology target, in accordance with some embodiments of the disclosure.

FIG. 13 shows a top view of a metrology target 104i, in accordance with some embodiments of the disclosure. The metrology target 104i is a cluster-type photonic crystalline structure, and includes a first pattern PAT1 and a second pattern PAT2. The first pattern PAT1 and the second pattern PAT2 are formed on a semiconductor substrate 110. The first pattern PAT1 is formed by multiple photonic crystals 210a, and the photonic crystals 210a are arranged in an array with the same pitch P. The second pattern PAT2 is formed by multiple photonic crystals 220a, and the photonic crystals 220a are arranged in an array with the same pitch P. In the metrology target 104i, the photonic crystals 210a and 220a have the same sectional shape and same size. In such embodiments, the sectional shape of the photonic crystals 210a and 220a is a polygon. In such embodiments, each sectional shape of the photonic crystals 210a and 220a is a rectangle or a square shape with a length L. In some embodiments, the pitch P and the length L are about 10 nm to 10 μm. In some embodiments, the sectional shape of the photonic crystals 210a and 220a is a hexagon, octagon, decagon, and so on. In some embodiments, the number of sides of the polygon shape is used to determine the center wavelength in the reflection light LR. With different polygon shapes of the same area, the photonic crystals 210a and 220a can also produce different depth of focus (DOF) slightly.

Figure 14:
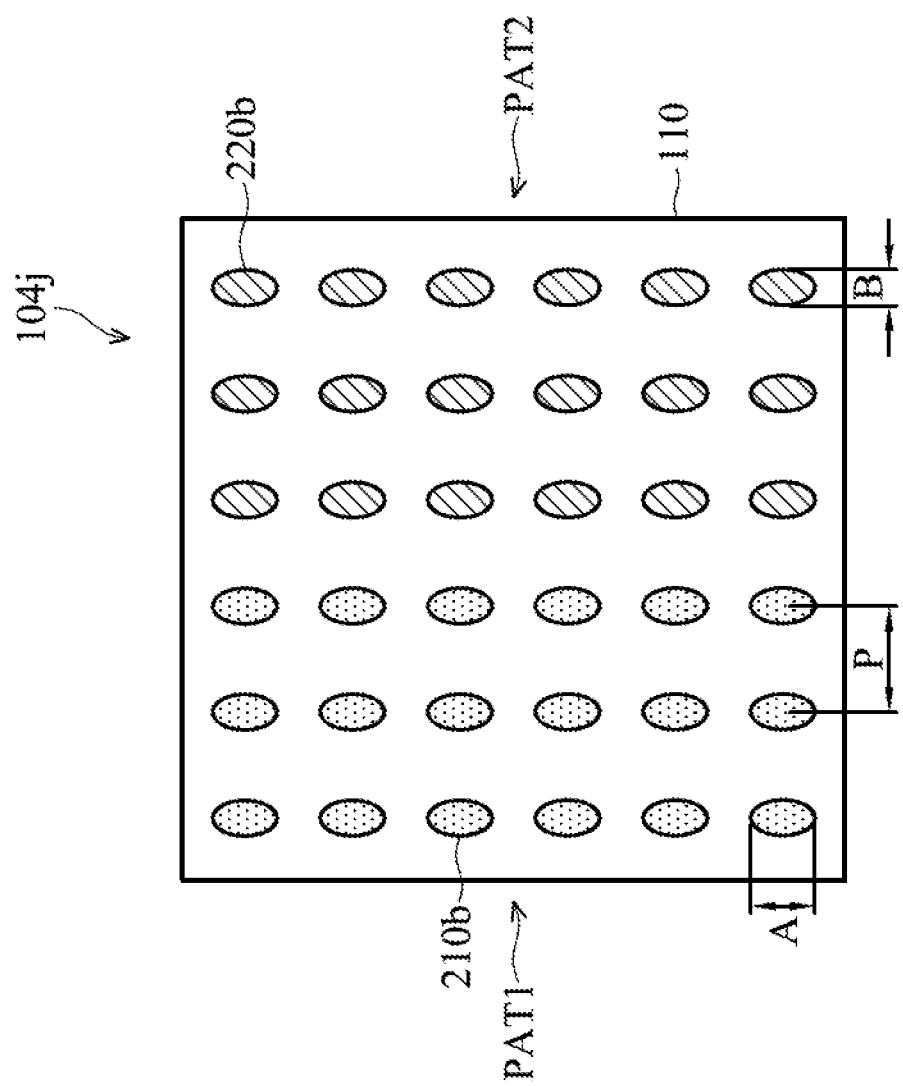
FIG. 14 shows a top view of a metrology target, in accordance with some embodiments of the disclosure.

FIG. 14 shows a top view of a metrology target 104j, in accordance with some embodiments of the disclosure. The metrology target 104j is a cluster-type photonic crystalline structure, and includes a first pattern PAT1 and a second pattern PAT2. The first pattern PAT1 is formed by multiple photonic crystals 210b, and the photonic crystals 210b are arranged in an array with the same pitch P. The second pattern PAT2 is formed by multiple photonic crystals 220b, and the photonic crystals 220b are arranged in an array with the same pitch P. In the metrology target 104j, the photonic crystals 210b and 220b have the same sectional shape and same size. In such embodiments, the sectional shape of the photonic crystals 210b and 220b is an axis-symmetry shape. In such embodiments, each sectional shape of the photonic crystals 210b and 220b is an elliptical shape with a major axis length A and a minor axis length B, and the major axis length A is larger than the minor axis length B (i.e., A>B). In some embodiments, the sectional shape of the photonic crystals 210a and 220a is a rhombus. In some embodiments, the pitch P, the major axis length A, and the minor axis length B are about 10 nm to 10 μm.

Figure 15A:
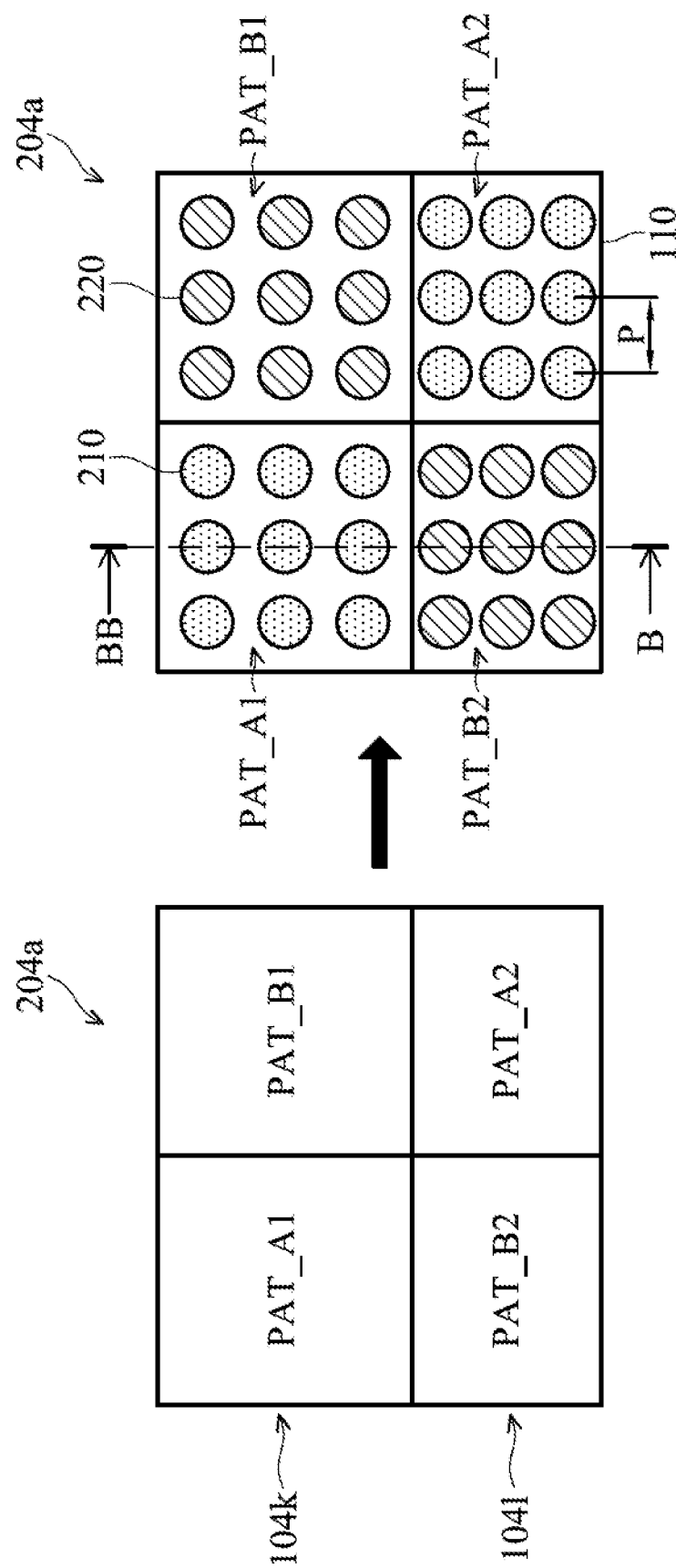
FIG. 15A shows a sectional view of a mixed metrology target, in accordance with some embodiments of the disclosure.

FIG. 15A shows a top view of a mixed metrology target 204a, in accordance with some embodiments of the disclosure. The mixed metrology target 204a is obtained by combining two metrology targets 104k and 104l, and the height of the metrology targets 104k and 104l are different. The metrology target 104k includes the patterns PAT_A1 and PAT_B1 with a first height. The pattern PAT_A1 is formed by multiple photonic crystals 210 arranged in an array with the same pitch P, and the pattern PAT_B1 is formed by multiple photonic crystals 220 arranged in an array with the same pitch. Furthermore, the metrology target 104l includes the patterns PAT_A2 and PAT_B2 with a second height, and the first height is higher than the second height. The pattern PAT_A2 is formed by multiple photonic crystals 210 arranged in an array with the same pitch P, and the pattern PAT_B2 is formed by multiple photonic crystals 220 arranged in an array with the same pitch P. The patterns PAT_A1, PAT_B1, PAT_A2 and PAT_B2 are formed on a semiconductor substrate 110.

Figure 15B:
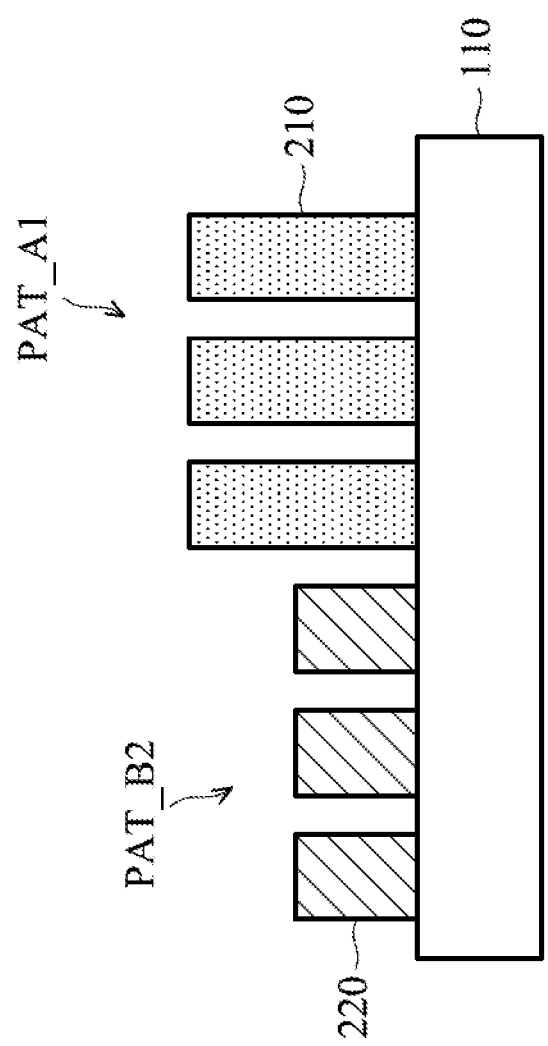
FIG. 15B shows a sectional view of the mixed metrology target of FIG. 15A along the line B-BB, in accordance with some embodiments of the disclosure.

FIG. 15B shows a sectional view of the mixed metrology target 204a of FIG. 15A along the line B-BB, in accordance with some embodiments of the disclosure. The photonic crystals 210 and the photonic crystals 220 are formed in the adjacent target layers on the semiconductor substrate 110. The bottoms of the photonic crystals 210 are level with those of the photonic crystals 220. However, the tops of the photonic crystals 210 are higher than those of the photonic crystals 220.

Figure 15C:
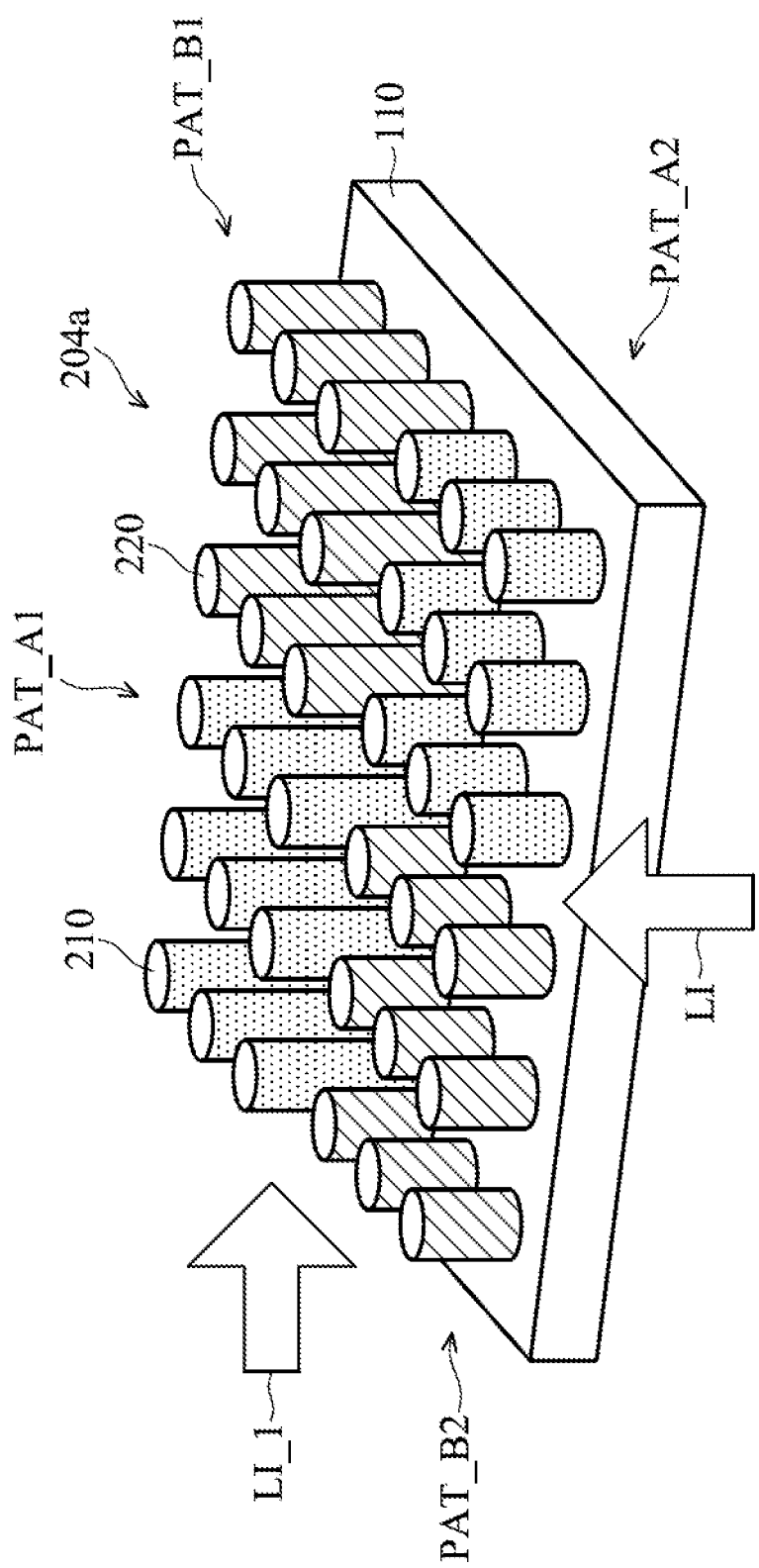
FIG. 15C shows a stereoscopic view of the mixed metrology target of FIG. 15A, in accordance with some embodiments of the disclosure.

FIG. 15C shows a stereoscopic view of the mixed metrology target 204a of FIG. 15A, in accordance with some embodiments of the disclosure. The photonic crystals 210 and 220 are the circular pillars formed of the same or different materials in the target layers. As described above, the pillars of the photonic crystals 210 are electrically insulated from each other, and also electrically insulated from the pillars of the photonic crystals 220.

For measuring the mixed metrology target 204a, the input light L1 and the input LI_1 are used. In some embodiments, the optical device 102 or the stage 107 of FIG. 1 is movable. In some embodiments, the input light L1 and the input LI_1 are provided by the optical device 102. For example, before the optical device 102 provides the input light LI_1, the input light L1 is provided by the optical device 102 and then the reflected light LR and the transmitted light LT corresponding to the input light L1 are obtained. Next, when the input light L1_1 is provided by the optical device 102, the reflected light LR and the transmitted light LT corresponding to the input light L1_1 are obtained. In some embodiments, the input light L1 and the input LI_1 are provided by different optical devices.

FIG. 15D shows the Bossung curves 310 and 320 of the mixed metrology target 204a of FIG. 15A, in accordance with some embodiments of the disclosure. Curve 310 is obtained according to the reflected light LR and the transmitted light LT corresponding to the input light L1_1, and curve 320 is obtained according to the reflected light LR and the transmitted light LT corresponding to the input light L1. In general, the Bossung curve is the most commonly applied tool used to analysis the lithographer. The analysis maps a control surface for critical dimensions (CDs) as a function of the variables of focus and exposure (dose). Most commonly the technique is used to calculate the optimum focus and dose process point that yields the greatest depth-of-focus (DoF) over a tolerable range of exposure latitude. According to the curves 310 and 320, the best focus BF of the mixed metrology target 204a is obtained. Furthermore, as the focus moves from the best focus, the CDs of the curves 310 and 320 also change. By using the photonic crystals 210 and 220 with different heights, the DoF of the mixed metrology target 204a is measured and analyzed.

Figure 16A:
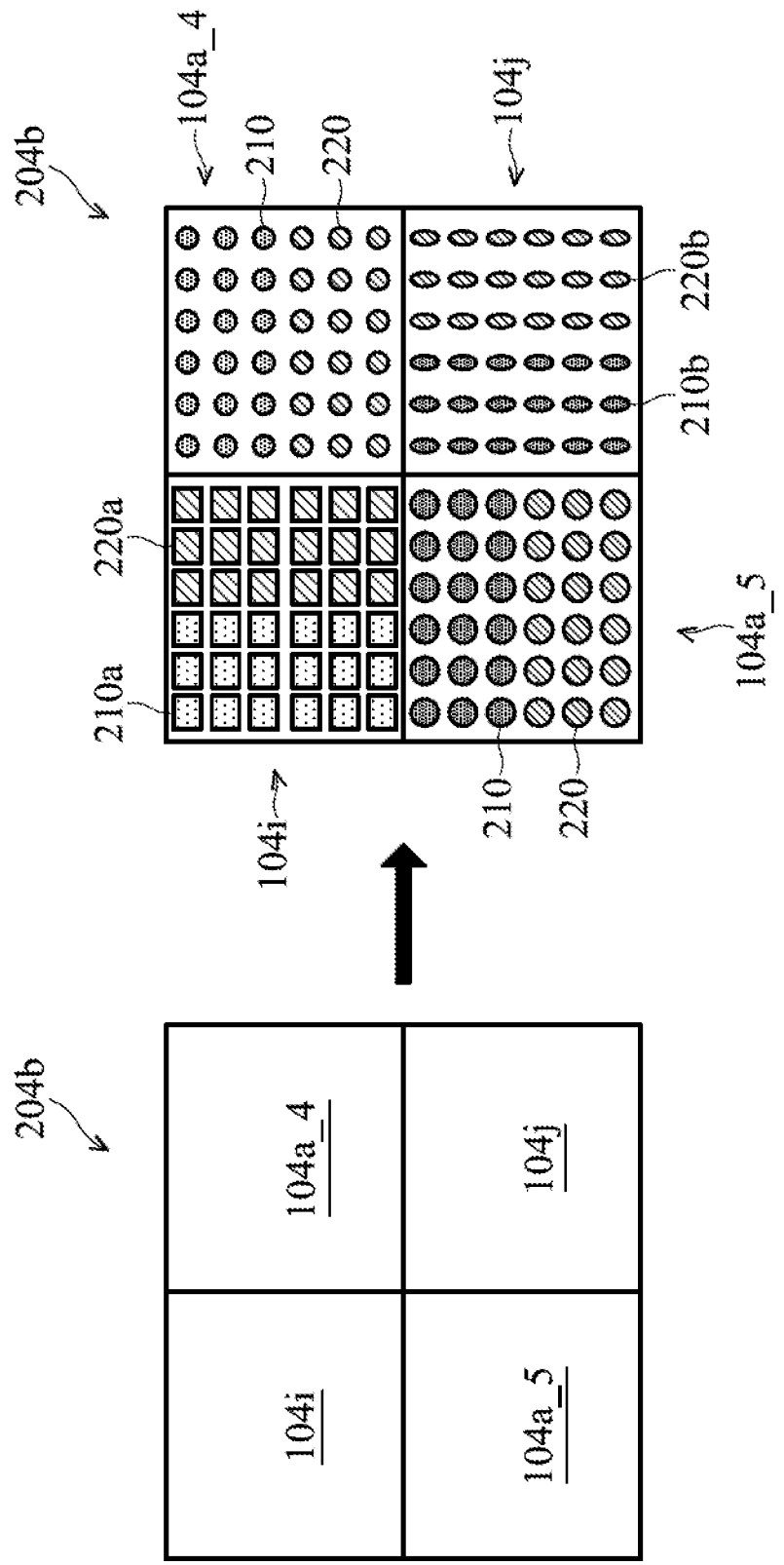
FIG. 16A shows a sectional view of a mixed metrology target, in accordance with some embodiments of the disclosure.

FIG. 16A shows a sectional view of a mixed metrology target 204b, in accordance with some embodiments of the disclosure. The mixed metrology target 204b is obtained by combining four metrology targets 104i of FIG. 13, 104j of FIG. 14, 104a_4 and 104a_5, and the heights of the metrology targets four metrology targets are identical. The metrology targets 104a_4 and 104a_5 are the variations of the metrology target 104a of FIG. 2. For example, the metrology targets 104a_4 and 104a_5 are obtained by rotating the metrology target 104a of FIG. 2 clockwise by 90 degrees and adjusting the radius R of the circular shape. In such embodiments, the radius R of photonic crystals 210 and 220 in the metrology target 104a_5 is larger than the radius R of photonic crystals 210 and 220 in the metrology target 104a_4.

Figure 16B:
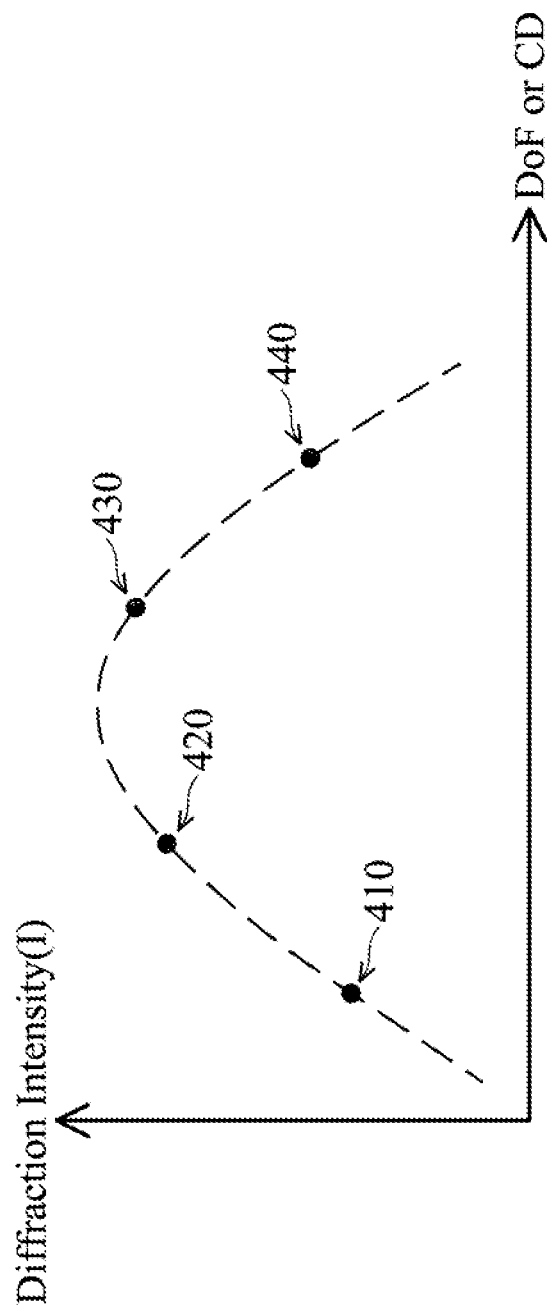
FIG. 16B illustrates the relationship between diffraction intensity (I) and DoF/CD of the mixed metrology target of FIG. 16A, in accordance with some embodiments of the disclosure.

FIG. 16B illustrates the relationship between diffraction intensity (I) and DoF/CD of the mixed metrology target 204b of FIG. 16A, in accordance with some embodiments of the disclosure. By using different metrology targets with different lengths, the DoF or CD curve can be calculated by multiple points, e.g., 4 points, of the equation $Y=aX^2+bX+c$. In some embodiments, the parameters a, b and c are unknown, and the DoF or CD curve can be calculated by at least 3 points (e.g., the points 410, 420, 430 or 440) to obtain the parameters a, b and c. In such embodiments, the point 410 is obtained according to the transmitted light LT and/or the reflected light LR corresponding to the metrology target 104i, and the point 420 is obtained according to the transmitted light LT and/or the reflected light LR corresponding to the metrology target 104a_4. Furthermore, the point 430 is obtained according to the transmitted light LT and/or the reflected light LR corresponding to the metrology target 104a_5, and the point 440 is obtained according to the transmitted light LT and/or the reflected light LR corresponding to the metrology target 104j.

Figure 17A:
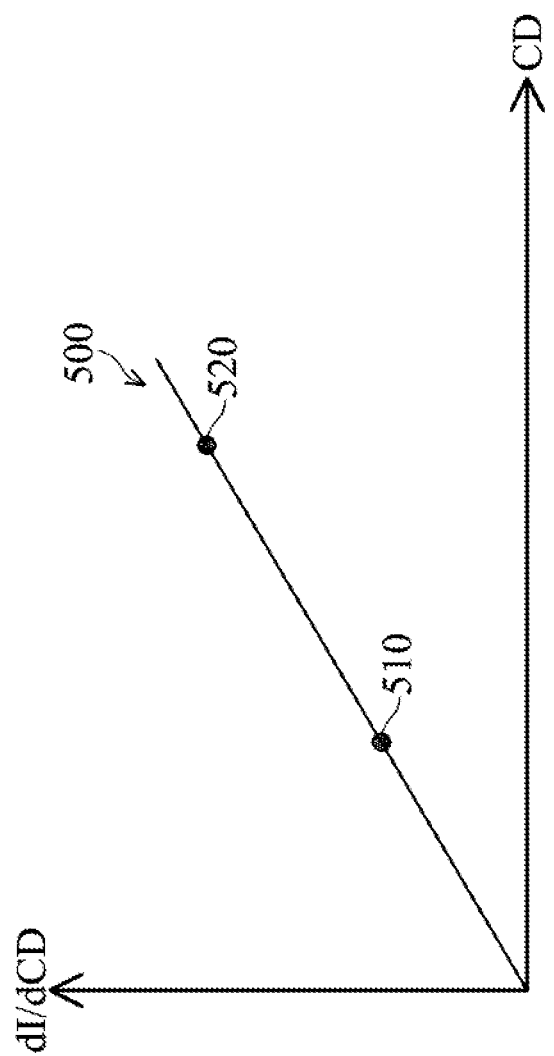
FIG. 17A illustrates the relationship between the differential of diffraction intensity (I) and CD (e.g., dI/dCD) of the metrology targets of FIG. 16A, in accordance with some embodiments of the disclosure.

FIG. 17A illustrates the relationship between the differential of diffraction intensity (I) and CD (e.g., dI/dCD) of the metrology targets 104a_4 and 104a_5 of FIG. 16A, in accordance with some embodiments of the disclosure. As described above, the metrology targets 104a_4 and 104a_5 of FIG. 16A have the same patterns and different radius R for the photonic crystals 210 and 220. In the curve 500, the point 510 represents DIFF1/DIFF2 (e.g., DIFF1 is divided by DIFF2) under the transmitted light LT with a first energy, and the point 520 represents DIFF1/DIFF2 under the transmitted light LT with a second energy higher than the first energy. DIFF1 represents differential diffraction intensity (I) to CD (e.g., dI/dCD) corresponding to the metrology target 104a_4, and DIFF2 represents differential diffraction intensity to CD corresponding to the metrology target 104a_5. According to the points 510 and 520, the relationship between CD and the intensity differential can be found, as shown in FIG. 17B.

Figure 17B:
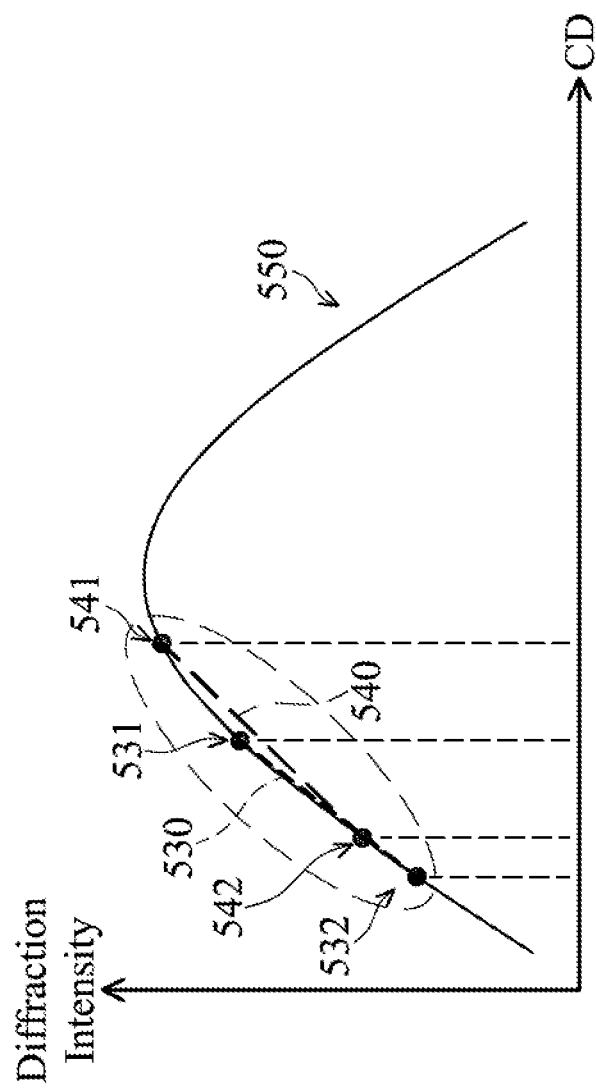
FIG. 17B illustrates the relationship between diffraction intensity (I) and CD of the mixed metrology target of FIG. 16A, in accordance with some embodiments of the disclosure.

Referring to FIG. 17B, the linear line 530 and the linear line 540 are obtained according to the points 510 and 520 of FIG. 17A, respectively. The linear line 530 is from the point 531 corresponding to the metrology target 104a_4 to the point 532 corresponding to the metrology target 104a_5, and the CD value corresponding to the point 531 is greater than the CD value corresponding to the point 532. Furthermore, the linear line 540 is from the point 541 corresponding to the metrology target 104a_4 to the point 542 corresponding to the metrology target 104a_5, and the CD value corresponding to the point 541 is greater than the CD value corresponding to the point 542. According to the high accuracy linear area (e.g., the linear lines 530 and 540), the curve 550 is obtained. By analyzing the characteristics of the curve 550, the processor 106 can determine whether CD meets the design specifications.

FIG. 18 shows a schematic illustrating a mixed metrology target 204c, in accordance with some embodiments of the disclosure. The mixed metrology target 204c is obtained by combining four metrology targets 104_A1, 104_A2, 104_B1, and 104_B2. The metrology targets 104_A1 and 104_A2 are used to measure overlay-shift between the photonic crystals corresponding to the first and second layer masks, and the metrology targets 104_B1 and 104_B2 are used to measure overlay-shift between the photonic crystals corresponding to the second and third layer masks or corresponding to the first and third layer masks. The first, second and third layer masks are used in successive patterning steps to form the features in different layers in the semiconductor structure 103. For example, the first layer mask is used to form MDs in the semiconductor structure 103, the second layer mask is used to form polys in the semiconductor structure 103, and the third layer mask is used to form ODs in the semiconductor structure 103. Furthermore, the third layer mask corresponding to ODs is used in a patterning step prior to the patterning step that forms the polys, and the second layer mask corresponding to polys is used in a patterning step prior to the patterning step that forms the MDs. In such embodiments, the metrology targets 104_A1 and 104_A2 are used to measure overlay-shift between the photonic crystals corresponding to the MD mask and the poly mask, and the metrology targets 104_B1 and 104_B2 are used to measure overlay-shift between the photonic crystals corresponding to the MD mask and the OD mask. In some embodiments, only the X direction overlay-shift is considered between the MD and poly layers, and only the Y direction overlay-shift is considered between the MD and OD layers. Specifically, the overlay-shifts between the first, second, and third layer masks are measurable through the mixed metrology target 204c.

FIG. 19 shows a schematic illustrating of a compound metrology target 304, in accordance with some embodiments of the disclosure. The compound metrology target 304 is obtained by combining three metrology targets 104_C, 104_D, and 104_E, and the mixed metrology target 204c of FIG. 18. By combining various metrology targets 104 and the mixed metrology targets 204, the overlay-shifts between the various masks (e.g., more than three masks) are measurable through the compound metrology target 304 for multi-layer overlay-shift measurement.

Figure 20A:
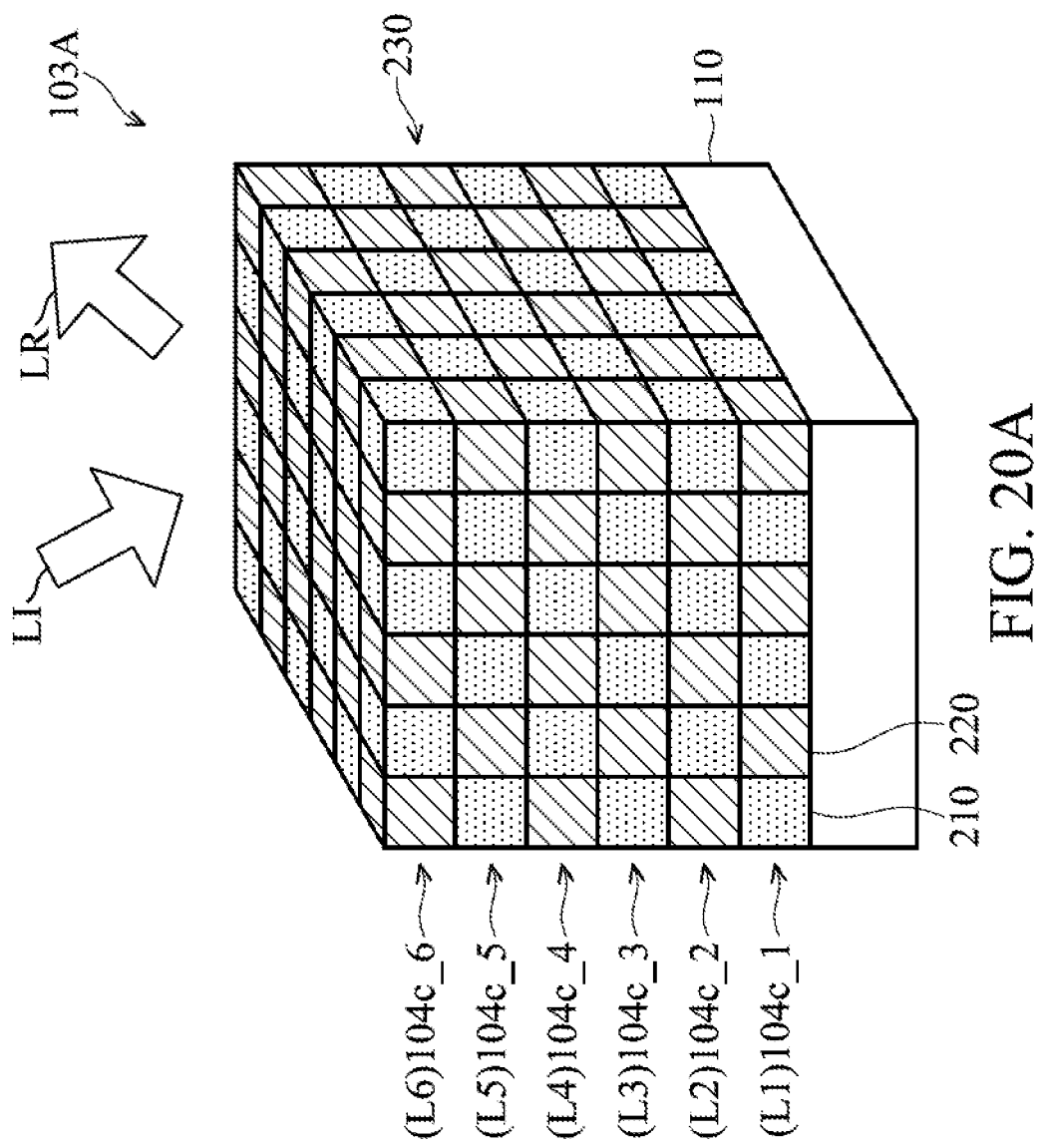
FIG. 20A shows a stereoscopic view of a semiconductor structure without overlay-shift, in accordance with some embodiments of the disclosure.

FIG. 20A shows a stereoscopic view of a semiconductor structure 103A without overlay-shift, in accordance with some embodiments of the disclosure. The semiconductor structure 103A includes a semiconductor substrate 110 and a stacked structure 230 on the semiconductor substrate 110. The stacked structure 230 is formed by stacking the metrology targets 104c_1 through 104c_6. The metrology targets 104c_1 through 104c_6 are crisscross-type photonic crystalline structures, and arrangements of the photonic crystals 210 and 220 of the metrology targets 104c_1 through 104c_6 are similar to the metrology targets 104c of FIG. 12B. For the convenience of explanation, the photonic crystals 210 and 220 are represented by squares. Furthermore, the features and material other than the photonic crystals 210 and 220 are omitted from the semiconductor structure 103A.

In such embodiments, the metrology target 104c_1 is formed in a material layer L1 on the substrate 110. The photonic crystals 210 and 220 of the metrology target 104c_1 are formed according to a first layer mask corresponding to the material layer L1 and a second layer mask corresponding to a material layer L2.

The metrology target 104c_2 is formed in the material layer L2 on the material layer L1. The photonic crystals 210 and 220 of the metrology target 104c_2 are formed according to the second layer mask corresponding to the material layer L2 and a third layer mask corresponding to a material layer L2.

The metrology target 104c_3 is formed in the material layer L3 on the material layer L2. The photonic crystals 210 and 220 of the metrology target 104c_3 are formed according to the third layer mask corresponding to the material layer L3 and a fourth layer mask corresponding to a material layer L4.

The metrology target 104c_4 is formed in the material layer L4 on the material layer L3. The photonic crystals 210 and 220 of the metrology target 104c_4 are formed according to the fourth layer mask corresponding to the material layer L4 and a fifth layer mask corresponding to a material layer L5.

The metrology target 104c_5 is formed in the material layer L5 on the material layer L4. The photonic crystals 210 and 220 of the metrology target 104c_5 are formed according to the fifth layer mask corresponding to the material layer L5 and a sixth layer mask corresponding to a material layer L6.

The metrology target 104c_6 is formed in the material layer L6 on the material layer L5. The photonic crystals 210 and 220 of the metrology target 104c_6 are formed according to the sixth layer mask corresponding to the material layer L7 and a seventh layer mask corresponding to a material layer L7 (not shown).

In some embodiments, the overlay-shift from the $N^{th}$ layer mask to the first layer mask is obtained according to the overlay-shifts of the two adjacent layer masks according to the following equation:

$$OVL_{Nto1} = OVL_{2to1} + OVL_{3to2} + OVL_{4to3} \cdots + OVLN_{N-1toN-2}.$$

For example, if N=6, the overlay-shift $OVL_{6to1}$ from the sixth layer mask to the first layer mask is obtained by summing the overlay-shift $OVL_{2to1}$ corresponding to the metrology target 104c_1, the overlay-shift $OVL_{3to2}$ corresponding to the metrology target 104c_2, the overlay-shift $OVL_{4to3}$ corresponding to the metrology target 104c_3, the overlay-shift $OVL_{5to4}$ corresponding to the metrology target 104c_4, and the overlay-shift $OVL_{6to5}$ corresponding to the metrology target 104c_5.

As described above, when the input light LI illuminates the stacked structure 230, the reflected light LR is obtained. According to the information regarding the characteristics of the reflected light LR, the processor 106 is capable of determining the overlay-shift between the metrology targets 104c_1 through 104c_6 for multi-layer overlay-shift measurement.

Figure 20B:
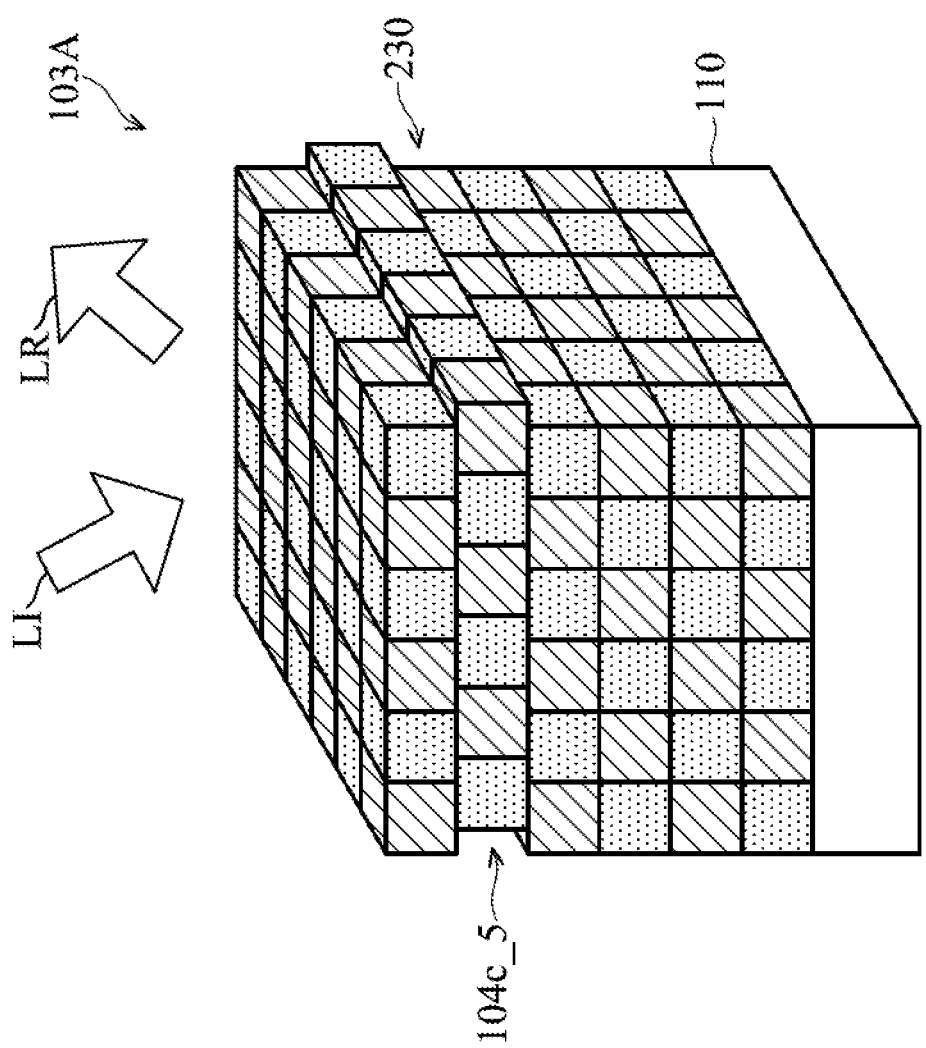
FIG. 20B shows a stereoscopic view of a semiconductor structure of FIG. 20A with an overlay-shift in the fifth material layer L5.

FIG. 20B shows a stereoscopic view of a semiconductor structure 103A of FIG. 20A with an overlay-shift in the fifth material layer L5. By analyzing the information regarding the characteristics (e.g., center wavelength shift, scattering wavelength count, scatter angle, center wavelength intensity, fill width at half maximum or photonic band gap) of the reflected light LR, the processor 106 can determined that an alignment error of the metrology targets 104c_1 through 104c_6 is present (e.g., OVL≠0). Furthermore, according to the variations of the characteristics of the reflected light LR and previous overlay-shift simulation results, the processor 106 can further determine which material layer will have an alignment error.

Figure 21:
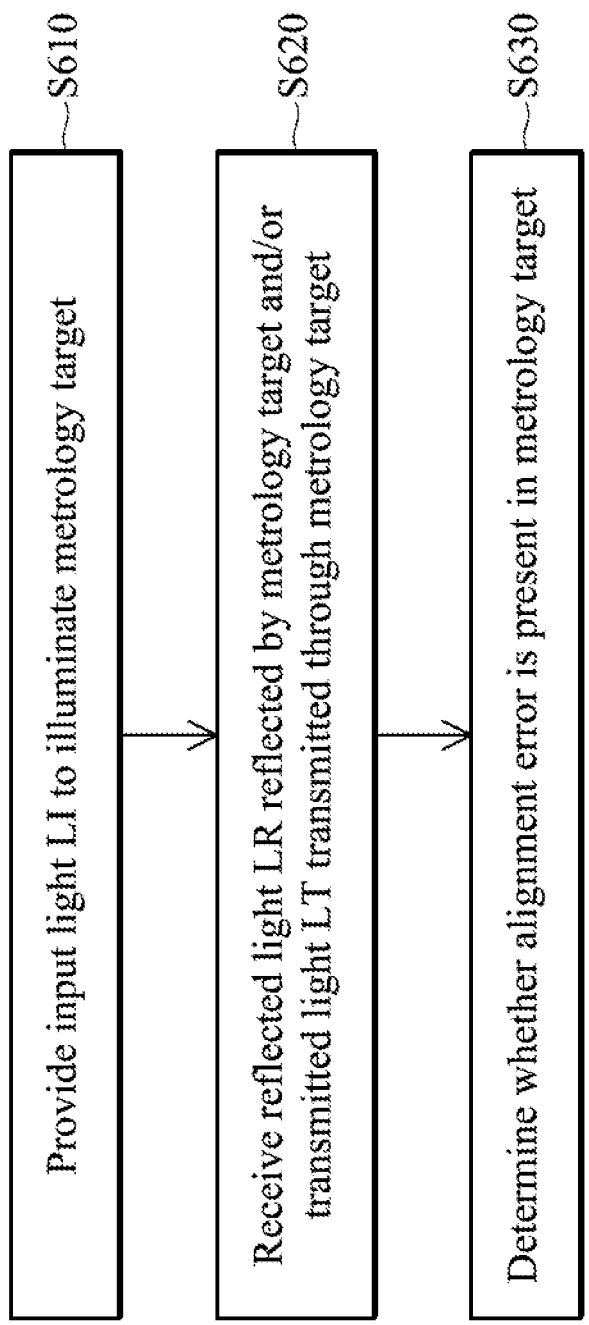
FIG. 21 shows a method for measuring a metrology target of a semiconductor structure, in accordance with some embodiments of the disclosure.

FIG. 21 shows a method for measuring a metrology target (or alignment mark) of a semiconductor structure, in accordance with some embodiments of the disclosure. The method is performed by a shift measurement system (e.g., 100 of FIG. 1). As described above, the metrology target may be a single metrology target 104, a mixed metrology target 204 or a compound metrology target 304 in a semiconductor structure 103. Furthermore, the metrology target includes at least a first pattern PAT1 formed by the photonic crystals 210 and a second pattern PAT2 formed by the photonic crystals 220.

In operation S610, an input light LI from an optical device (e.g., 102 of FIG. 1) is provided to illuminate the metrology target. In some embodiments, the input light LI is a pulsed or broadband light. In some embodiments, the input light LI horizontally illuminates the metrology target (e.g., illuminates the side of the metrology target), so as to horizontally penetrate the metrology target. In some embodiments, the input light LI illuminates the surface of metrology target.

In operation S620, in response to the input light LI, the reflected light LR reflected by the metrology target and/or the transmitted light LT transmitted through the metrology target are received.

As described above, if no alignment error of the photonic crystals 210 and 220 exists, the characteristics of the reflected light LR and/or the transmitted light LT are substantially similar to those of the input light LI.

In operation S630, the shift measurement system is capable of determining whether an alignment error is present between the first pattern PAT1 and the second pattern PAT2 according to the characteristics of the reflected light LR and/or the transmitted light LT. In some embodiments, the center wavelength shift, scattering wavelength count, scatter angle, center wavelength intensity, full width at half maximum or photonic band gap of the reflected light LR and/or the transmitted light LT are measured, so as to obtain the overlay-shift of the metrology target. As described above, by using photonic crystals with different heights, the depth-of-focus of the semiconductor structure is obtained according to the characteristics of the reflected light LR and/or the transmitted light LT. Moreover, by analyzing the diffraction intensity of the reflected light LR and/or the transmitted light LT corresponding to various energy of the input light LI associated with the mixed or compound metrology target, the CD of the semiconductor structure is obtained.

If it is determined that no alignment error of the photonic crystals 210 and 220 exists, i.e., the overlay-shift of the metrology target is zero (e.g., OVL=0), the subsequent processes (e.g., the following patterning steps) will be performed. Conversely, if it is determined that an alignment error of the photonic crystals 210 and 220 exists, i.e., the overlay-shift of the metrology target is not equal to zero (e.g., OVL≠0), the semiconductor structure 103 will be verified.

Embodiments of the semiconductor structure, overlay-shift measurement system, and method for measuring a metrology target (or alignment mark) of semiconductor structure are provided. A metrology target (or alignment mark) is arranged on a substrate of the semiconductor structure for overlay-shift measurement, and the metrology target includes a first pattern PAT1 formed by the photonic crystals 210 and a second pattern PAT2 formed by the photonic crystals 220. The bottoms of the photonic crystals 210 are level with those of the photonic crystals 220. In some embodiments, the metrology target is a single metrology target, a mixed metrology target, or a compound metrology target. By adjusting the sectional shapes and sizes of the photonic crystals 210 and 220, accuracy of the overlay-shift is increased. Furthermore, by using the photonic crystals 210 and 220 corresponding to various layer masks, multi-layer overlay-shift measurement is obtained through measuring the metrology target. Moreover, by using the photonic crystals with different heights, the DoF of the semiconductor structure is measured through measuring the metrology target. Furthermore, by using multiple metrology targets, CD of the semiconductor structure is measured according to the diffraction intensity of the reflected light LR and/or the transmitted light LT with various energy of the input light LI. Thus, manufacturing cost and cycle time are decreased due to CD, DoF and overlay-shift are simultaneously measured through a multi-functional metrology target.

In some embodiments, an overlay-shift measurement system is provided. The overlay-shift measurement system includes an optical device, a first light detection device and a processor. The optical device is configured to provide an input light to a metrology target of a semiconductor structure. The first light detection device is configured to receive a transmitted light from the metrology target when the input light penetrates the metrology target. The processor is configured to determine whether overlay-shift between a plurality of first photonic crystals and a plurality of second photonic crystals in the metrology target is present according to characteristics of the transmitted light.

In some embodiments, an overlay-shift measurement system is provided. The overlay-shift measurement system includes an optical device, a first light detection device, and a processor. The optical device is configured to provide an input light to a metrology target of a semiconductor structure. The first light detection device is configured to receive a reflected light from the metrology target when the input light illuminates the metrology target. The processor is configured to determine whether overlay-shift between a plurality of first photonic crystals and a plurality of second photonic crystals in the metrology target is present according to characteristics of the reflected light. The first and second photonic crystals have two heights on the semiconductor structure.

In some embodiments, an overlay-shift measurement system is provided. The overlay-shift measurement system includes an optical device, a first light detection device, a second light detection device, and a processor. The optical device is configured to provide an input light to a metrology target of a semiconductor structure. The first light detection device is configured to receive a transmitted light from the metrology target when the input light penetrates the metrology target. The second light detection device is configured to receive a reflected light from the metrology target when the input light illuminates the metrology target. The processor is configured to determine whether overlay-shift between a plurality of first photonic crystals and a plurality of second photonic crystals in the metrology target is present according to characteristics of the transmitted light and the reflected light. The first photonic crystals and the second photonic crystals are formed by different materials.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An overlay-shift measurement system, comprising:
    an optical device configured to provide an input light to a metrology target of a semiconductor structure;
    a first light detection device configured to receive a transmitted light from the metrology target when the input light penetrates the metrology target;
    a processor configured to determine whether overlay-shift between a plurality of first photonic crystals and a plurality of second photonic crystals in the metrology target is present according to characteristics of the transmitted light; and
    a second light detection device configured to receive a reflected light from the metrology target when the input light illuminates the metrology target,
    wherein the processor is configured to determine whether the overlay-shift is present according to the characteristics of both the transmitted light and the reflected light.

2. The overlay-shift measurement system as claimed in claim 1, wherein the metrology target comprises a first pattern formed by the first photonic crystals with a first pitch, and a second pattern formed by the second photonic crystals with a second pitch, wherein the first light detection device is configured to receive the transmitted light from the first and second patterns when the input light penetrates the first and second patterns.

3. The overlay-shift measurement system as claimed in claim 2, wherein the first and second photonic crystals have the same sectional shape, and the first pitch is equal to the second pitch.

4. The overlay-shift measurement system as claimed in claim 1, wherein the characteristics of the transmitted light comprise information regarding center wavelength shift, scattering wavelength count, scatter angle, center wavelength intensity, full width at half maximum or photonic band gap.

5. The overlay-shift measurement system as claimed in claim 1, wherein the processor is configured to obtain a critical dimension of the semiconductor structure according to the characteristics of the transmitted light.

6. The overlay-shift measurement system as claimed in claim 1, wherein the processor is configured to obtain depth-of-focus of the semiconductor structure according to the characteristics of the transmitted light.

7. The overlay-shift measurement system as claimed in claim 1, wherein the first photonic crystals are separated from the second photonic crystals.

8. The overlay-shift measurement system as claimed in claim 1, wherein the first and the second photonic crystals have the same height on the semiconductor structure.

9. The overlay-shift measurement system as claimed in claim 1, wherein the first photonic crystals are arranged in a first array and the second photonic crystals are arranged in a second array with the same pitch.

10. The overlay-shift measurement system as claimed in claim 1, wherein the first and the second photonic crystals have different heights on the semiconductor structure.

11. An overlay-shift measurement system, comprising:
an optical device configured to provide an input light to a metrology target of a semiconductor structure;
a first light detection device configured to receive a reflected light from the metrology target when the input light illuminates the metrology target;
a processor configured to determine whether overlay-shift between a plurality of first photonic crystals and a plurality of second photonic crystals in the metrology target is present according to characteristics of the reflected light; and
a second light detection device configured to receive a transmitted light from the metrology target when the input light penetrates the metrology target,
wherein the processor is configured to determine whether the overlay-shift is present according to the characteristics of both the transmitted light and the reflected light,
wherein the first and second photonic crystals have two heights on the semiconductor structure.

12. The overlay-shift measurement system as claimed in claim 11, wherein the metrology target comprises a first pattern formed by the first photonic crystals with a first pitch, and a second pattern formed by the second photonic crystals with a second pitch, wherein the first light detection device is configured to receive the reflected light from the first and second patterns when the input light illuminates the first and second patterns.

13. The overlay-shift measurement system as claimed in claim 12, wherein the first and second photonic crystals have the same sectional shape, and the first pitch is equal to the second pitch.

14. The overlay-shift measurement system as claimed in claim 11, wherein the characteristics of the reflected light comprise information regarding center wavelength shift, scattering wavelength count, scatter angle, center wavelength intensity, full width at half maximum or photonic band gap.

15. The overlay-shift measurement system as claimed in claim 11, wherein the processor is configured to obtain a critical dimension of the semiconductor structure according to the characteristics of the reflected light.

16. The overlay-shift measurement system as claimed in claim 11, wherein the processor is configured to obtain depth-of-focus of the semiconductor structure according to the characteristics of the reflected light.

17. An overlay-shift measurement system, comprising:
an optical device configured to provide an input light to a metrology target of a semiconductor structure;
a first light detection device configured to receive a transmitted light from the metrology target when the input light penetrates the metrology target;
a second light detection device configured to receive a reflected light from the metrology target when the input light illuminates the metrology target; and
a processor configured to determine whether overlay-shift between a plurality of first photonic crystals and a plurality of second photonic crystals in the metrology target is present according to characteristics of the transmitted light and the reflected light,
wherein the first photonic crystals and the second photonic crystals are formed by different materials.

18. The overlay-shift measurement system as claimed in claim 17, wherein the processor is configured to obtain a critical dimension of the semiconductor structure according to the characteristics of the transmitted light and the reflected light.

19. The overlay-shift measurement system as claimed in claim 17, wherein the processor is configured to obtain depth-of-focus of the semiconductor structure according to the characteristics of the transmitted light and the reflected light.

20. The overlay-shift measurement system as claimed in claim 17, wherein the first photonic crystals are separated from the second photonic crystals, and the first and the second photonic crystals have the same height on the semiconductor structure.

* * * * *